(12) United States Patent
Mahnkopf et al.

(10) Patent No.: US 11,410,908 B2
(45) Date of Patent: Aug. 9, 2022

(54) INTEGRATED CIRCUIT DEVICES WITH FRONT-END METAL STRUCTURES

(71) Applicant: Intel IP Corporation, Santa Clara, CA (US)

(72) Inventors: Reinhard Mahnkopf, Oberhaching (DE); Sonja Koller, Regensburg (DE); Andreas Wolter, Regensburg (DE)

(73) Assignee: Intel Corporation, Santa Clara, CA (US)

( * ) Notice: Subject to any disclaimer, the term of this patent is extended or adjusted under 35 U.S.C. 154(b) by 897 days.

(21) Appl. No.: 16/018,268

(22) Filed: Jun. 26, 2018

(65) Prior Publication Data

US 2019/0393130 A1    Dec. 26, 2019

(51) Int. Cl.

| | |
|---|---|
| *H01L 23/373* | (2006.01) |
| *H01L 27/12* | (2006.01) |
| *H01L 23/367* | (2006.01) |
| *H01L 23/498* | (2006.01) |
| *H01L 21/768* | (2006.01) |
| *H01L 23/00* | (2006.01) |

(52) U.S. Cl.
CPC .... *H01L 23/3736* (2013.01); *H01L 21/76846* (2013.01); *H01L 21/76877* (2013.01); *H01L 23/367* (2013.01); *H01L 23/49816* (2013.01); *H01L 24/09* (2013.01); *H01L 27/1211* (2013.01); *H01L 2924/15311* (2013.01)

(58) Field of Classification Search
CPC ......... H01L 21/76846; H01L 21/76877; H01L 23/367; H01L 23/3736; H01L 23/481; H01L 23/535; H01L 24/09; H01L 27/1211

See application file for complete search history.

(56) References Cited

U.S. PATENT DOCUMENTS

| | | | |
|---|---|---|---|
| 8,674,423 B2* | 3/2014 | Collins ................. | H01L 23/642 257/301 |
| 2014/0131884 A1* | 5/2014 | Lin ................... | H01L 21/76898 257/774 |
| 2014/0203827 A1* | 7/2014 | Thangaraju ....... | H01L 21/76898 324/713 |

* cited by examiner

*Primary Examiner* — Allan R Wilson
(74) *Attorney, Agent, or Firm* — Patent Capital Group

(57) ABSTRACT

Present disclosure relates to IC devices with thermal mitigation structures in the form of metal structures provided in a semiconductor material of a substrate on which active electronic devices are integrated (i.e., front-end metal structures). In one aspect, an IC device includes a substrate having a first face and a second face, where at least one active electronic device is integrated at the first face of the substrate. The IC device further includes at least one front-end metal structure that extends from the first face of the substrate into the substrate to a depth that is smaller than a distance between the first face and the second face. Providing front-end metal structures may enable improved cooling options because such structures may be placed in closer vicinity to the active electronic devices, compared to conventional thermal mitigation approaches.

22 Claims, 19 Drawing Sheets

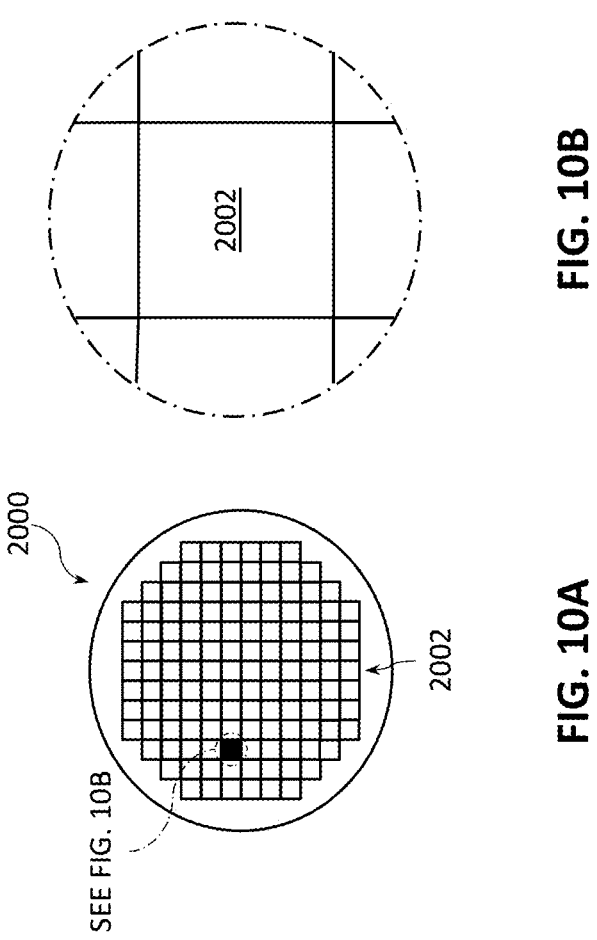

INTEGRATED CIRCUIT DEVICES WITH FRONT-END METAL STRUCTURES

TECHNICAL FIELD

The present disclosure relates generally to the field of integrated circuit (IC) devices.

BACKGROUND

Heat spreaders may be used to move heat away from an active electronic component of an IC device so that the heat can be more readily dissipated by a heat sink or other thermal management device. Continuous shrinking of transistors and other components of ICs exacerbates problems related to formation of hot spots, calling for novel and unconventional thermal mitigation options.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 10A-10B are top views of a wafer and dies that may include one or more front-end metal structures in accordance with any of the embodiments disclosed herein.

DETAILED DESCRIPTION

Overview

Figure 1A:
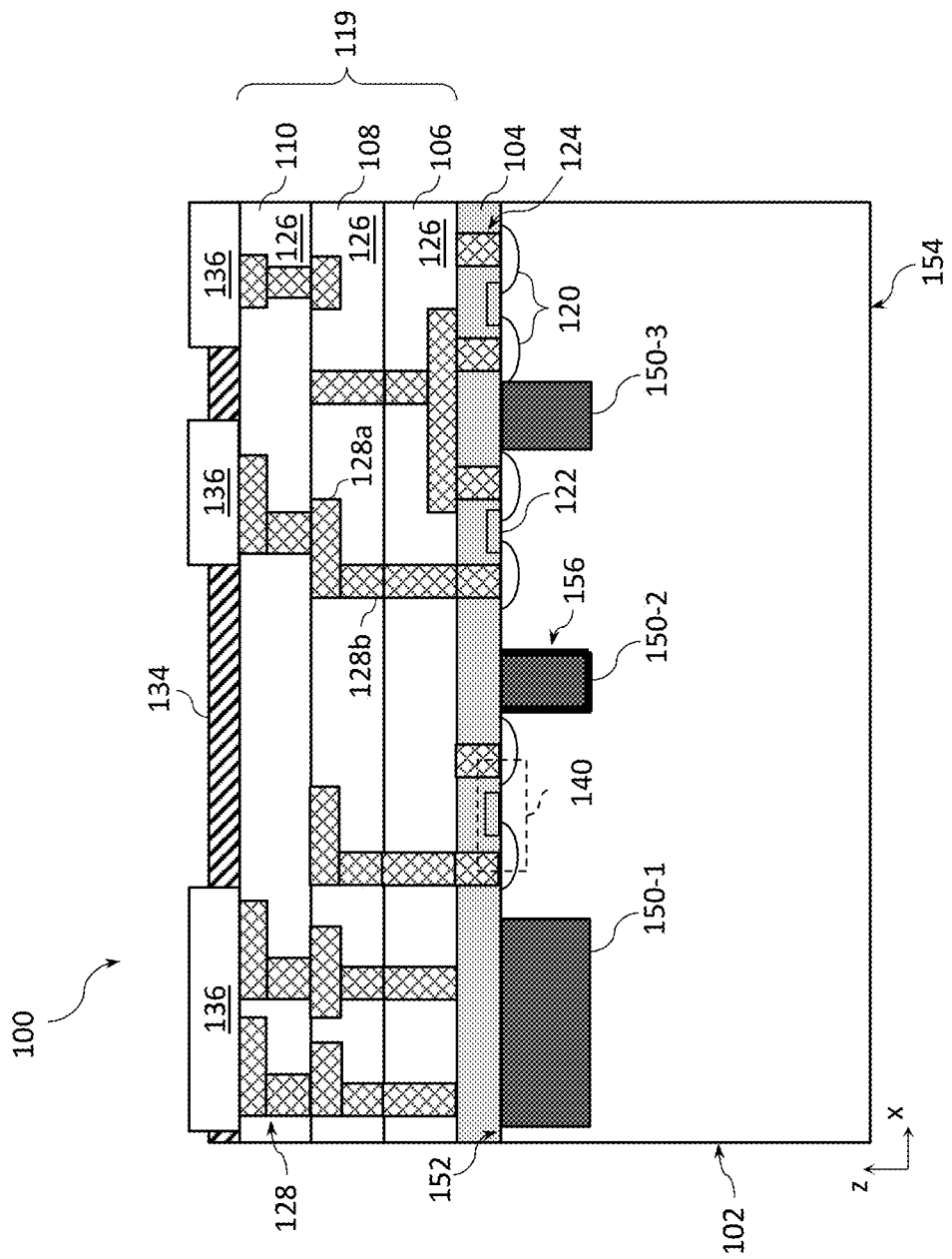
FIG. 1A is a cross-sectional side view of an IC device that may include one or more front-end metal structures, according to some embodiments of the present disclosure.

For purposes of illustrating thermal mitigation structures as proposed herein, it is important to understand phenomena that may come into play during operation of electronic devices. The following foundational information may be viewed as a basis from which the present disclosure may be properly explained. Such information is offered for purposes of explanation only and, accordingly, should not be construed in any way to limit the broad scope of the present disclosure and its potential applications.

Operation of electronic devices generates heat. Thermal mitigation, also known as thermal management, refers to a range of techniques aiming to keep the operating temperatures of electronic devices within the prescribed thermal budget established for safe device and component operation. Common approaches to thermal mitigation typically involve using some thermal mitigation structures either on a package level of an IC package (i.e., when an IC device is attached to a package substrate) or on the chip backside. As transistor sizes continue to decrease, these common approaches are not always sufficiently adequate.

Disclosed herein are IC devices with thermal mitigation structures in the form of metal structures provided in a semiconductor material of a substrate on which active electronic devices (e.g., transistors) are integrated. Such metal structures may be referred to as "front-end" or "front end of line" (FEOL) because they may be formed as part of front-end fabrication operations, which operations also include integration of the active electronic devices on the substrate. In one aspect, an IC device includes a substrate having a first face and an opposite second face, where at least one active electronic device is integrated at the first face of the substrate. The IC device further includes at least one metal structure in a semiconductor material of the substrate (i.e., the metal structure is a front-end metal structure), the structure extending from the first face of the substrate into the substrate to a depth that is smaller than a distance between the first face and the second face (i.e., the metal structure does not extend all the way through the substrate, e.g., the metal structure may be implemented as a blind via). Providing front-end metal structures may enable improved cooling options because such structures may be placed in closer vicinity to the active electronic devices, compared to conventional thermal mitigation approaches, which may, in turn, accelerate dissipation of heat produced during operation of the electronic devices. In various embodiments, front-end metal structures described herein may be used in combination with known thermal mitigation measures, which may make the known measures more efficient because the front-end metal structures described herein may provide improved paths to transfer heat from heat sources to thermal mitigation structures such as on-die or on-package thermal mitigation elements, heat exchangers, etc.

Various front-end metal structures as described herein may be implemented in one or more components associated with an IC device or an IC package, and/or between various such components or packages, where the front-end metal structures described herein may provide improved cooling of different dies or other elements. In various embodiments, components associated with an IC include, e.g., transistors, diodes, power sources, resistors, capacitors, inductors, sensors, transceivers, receivers, antennas, etc. Components associated with an IC may include those that are mounted on an IC, provided as an integral part of an IC, or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Various ones of the embodiments disclosed herein may provide improved thermal management for complex computing device designs, such as those involving multiple active electronic devices provided in an IC device, or multiple IC packages distributed on a circuit board. Such complex computing device designs may arise in large computing server applications, "patch/package-on-interposer" configurations, and "package-on-package" configurations, among others. Additionally, various ones of the embodiments disclosed herein may be beneficially applied in computing tablets in which it may be advantageous to dissipate heat from computing components in the tablet both in the direction normal to the plane of the tablet and within the plane of the tablet. Various ones of the embodiments disclosed herein may include innovative material combinations, manufacturing techniques, and geometrical features.

For purposes of explanation, specific numbers, materials and configurations are set forth in order to provide a thorough understanding of the illustrative implementations. However, it will be apparent to one skilled in the art that the present disclosure may be practiced without the specific details and/or that the present disclosure may be practiced with only some of the described aspects. In other instances, well known features are omitted or simplified in order not to obscure the illustrative implementations.

In the following detailed description, reference is made to the accompanying drawings that form a part hereof, and in which are shown, by way of illustration, embodiments that may be practiced. For convenience, the phrase "FIG. X" may be used to refer to the collection of drawings of FIGS. XA, XB, and so on. For example, the phrase "FIG. 1" may be used to refer to the collection of drawings of FIGS. 1A-1C. Some drawings may not necessarily illustrate a reference numeral pointing to each element that may be described and shown, in order to not clutter the drawings. For example, in FIG. 1A, a reference numeral "140" points to only one transistor even though three such transistors are shown, or a reference numeral "128b" points only to one via structure even though multiple such via structures are shown. The accompanying drawings are not necessarily drawn to scale. For example, to clarify various layers, structures, and regions, the thickness of some layers may be enlarged. Furthermore, while drawings illustrating various structures/assemblies of example devices may be drawn with precise right angles and straight lines, real world process limitations may prevent implementations of devices exactly as shown. Therefore, it is understood that such drawings revised to reflect example real world process limitations, in that the features may not have precise right angles and straight lines, are within the scope of the present disclosure. Drawings revised in this manner may be more representative of real world structure/assemblies as may be seen on images using various characterization tools, such as e.g., scanning electron microscopy (SEM) or transmission electron microscopy (TEM). In addition, the various structures/assemblies of the present drawings may further include possible processing defects, such as e.g., the rounding of corners, the drooping of the layers/lines, unintentional gaps and/or discontinuities, unintentionally uneven surfaces and volumes, etc., although these possible processing defects may not be specifically shown in the drawings. It is to be understood that other embodiments may be utilized and structural or logical changes to the drawings and descriptions may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Furthermore, stating in the present disclosure that any part (e.g., a layer, film, area, or plate) is in any way positioned on or over (e.g., positioned on/over, provided on/over, located on/over, disposed on/over, formed on/over, etc.) another part means that the referenced part is either in contact with the other part, or that the referenced part is above the other part with one or more intermediate part(s) located therebetween. On the other hand, stating that any part is in contact with another part means that there is no intermediate part between the two parts.

The terms "substantially," "close," "approximately," "near," and "about," generally refer to being within +/−20% of a target value. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, terms "oxide," "carbide," "nitride," etc. may refer to compounds containing, respectively, oxygen, carbon, nitrogen, etc. In another example, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function. Furthermore, unless specified otherwise, as used herein, the term "thermally conductive material" may refer to a single thermally conductive material or a combination of various thermally conductive materials, e.g., different thermally conductive materials that may be mixed or stacked over one another.

IC Devices with Front-End Metal Structures

FIG. 1A is a cross-sectional side view of an IC device 100 that may include one or more front-end metal structures in accordance with any of the embodiments disclosed herein. One or more of the IC devices 100 may be included in a die (e.g., the die 2002 of FIG. 10).

The IC device 100 may be formed on a substrate 102 (e.g., the wafer 2000 of FIG. 10). The substrate 102 may include any material that may serve as a foundation for an IC device 100. The substrate 102 may be a semiconductor substrate composed of semiconductor material systems including, for example, N-type or P-type materials systems. The substrate 102 may include, for example, a crystalline substrate formed using a bulk silicon (or other bulk semiconductor material) or a silicon-on-insulator (SOI) structure (or, in general, a semiconductor-on-insulator structure). In some embodiments, the substrate 102 may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the substrate 102 may be non-crystalline. In some embodiments, the substrate 102 may be a printed circuit board (PCB). In some embodiments, the substrate 102 may be inhomogeneous, e.g., including a carrier material (such as glass or silicon carbide) with a thin semiconductor layer at the first or upper face 152. Although a few examples of the substrate 102 are described here, any material or structure that may serve as a foundation upon which an IC device 100 may be built falls within the spirit and scope of the present disclosure. The substrate 102 may be part of a singulated die (e.g., the die 2002 of FIG. 10) or a wafer (e.g., the wafer 2000 of FIG. 10).

The IC device 100 may include one or more device layers 104 disposed on the substrate 102. The device layer 104 may include features of one or more transistors 140, e.g., metal oxide semiconductor field-effect transistors (MOSFETs), formed on the substrate 102. The device layer 104 may include, for example, one or more source and/or drain (S/D) regions 120, a gate 122 to control current flow in the transistors 140 between the S/D regions 120, and one or more S/D contacts 124 to route electrical signals to/from the S/D regions 120. Various transistors 140 are not limited to the type and configuration depicted in FIG. 1A and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors. The transistors 140 may include additional features not depicted for the sake of clarity, such as device isolation regions, gate contacts, and the like. Although a particular number of transistors 140 is depicted in FIG. 1A, embodiments of the present disclosure include IC devices having more or fewer transistors than depicted.

Each transistor 140 may include a gate 122 formed of at least two layers, a gate dielectric layer and a gate electrode layer. Generally, the gate dielectric layer of a transistor 140 may include one layer or a stack of layers, and the one or more layers may include silicon oxide, silicon dioxide, and/or a high-k dielectric material. The high-k dielectric material included in the gate dielectric layer of the transistor 140 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one P-type work function metal or N-type work function metal, depending on whether the transistor 140 is to be a P-type metal oxide semiconductor (PMOS) or an N-type metal oxide semiconductor (NMOS) transistor. In some implementations, the gate electrode may include a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 140 along the source-channel-drain direction, the gate electrode may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 120 may be formed within the substrate 102, e.g., adjacent to the gate of each transistor 140. The S/D regions 120 may be formed using an implantation/diffusion process or an etching/deposition process, for example. In the former process, dopants such as boron, aluminum, antimony, phosphorous, or arsenic may be ion-implanted into the substrate 102 to form the S/D regions 120. An annealing process that activates the dopants and causes them to diffuse farther into the substrate 102 may follow the ion-implantation process. In the latter process, the substrate 102 may first be etched to form recesses at the locations of the S/D regions 120. An epitaxial deposition process may then be carried out to fill the recesses with material that is used to fabricate the S/D regions 120. In some implementations, the S/D regions 120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 120 may be formed using one or more alternate semiconductor materials such as germanium or a group III-V material or alloy. In further embodiments, one or more layers of metal and/or metal alloys may be used to form the S/D regions 120.

It should be noted that, while the IC device 100 shown in FIG. 1A illustrates active electronic components as the transistors 140, in various other embodiments, the IC device 100 may include active electronic devices other than transistors 140, e.g., attenuators, amplifiers, filters, etc. Thus, in general, embodiments where the "transistors 140" of the IC device 100 are referred to also include embodiments where any other active electronic components are used in the one or more device layers 104, either instead of or in addition to the transistors.

Electrical signals, such as power and/or input/output (I/O) signals, may be routed to and/or from the transistors 140 of the device layer 104 through one or more interconnect layers disposed on the device layer 104 (illustrated in FIG. 1A as interconnect layers 106-110). For example, electrically conductive features of the device layer 104 (e.g., the gate 122 and the S/D contacts 124) may be electrically coupled with the interconnect structures 128 of the interconnect layers 106-110. The one or more interconnect layers 106-110 may form a metallization stack 119 (also referred to as an interlayer dielectric (ILD) stack) of the IC device 100. The one or more interconnect layers 106-110 may be referred to as "back-end" or "back end of line" (BEOL) because they may be formed as part of back-end fabrication operations.

The interconnect structures 128 may be arranged within the interconnect layers 106-110 to route electrical signals according to a wide variety of designs (in particular, the arrangement is not limited to the particular configuration of interconnect structures 128 depicted in FIG. 1A). Although a particular number of interconnect layers 106-110 is depicted in FIG. 1A, embodiments of the present disclosure include IC devices having more or fewer interconnect layers than depicted.

In some embodiments, the interconnect structures 128 may include trench structures 128a (sometimes referred to as "lines") and/or via structures 128b (sometimes referred to as "holes") filled with an electrically conductive material such as a metal. The trench structures 128a may be arranged to route electrical signals in a direction of a plane that is substantially parallel with a surface of the substrate 102 upon which the device layer 104 is formed. For example, the trench structures 128a may route electrical signals in a direction in and out of the page from the perspective of FIG. 1A. The via structures 128b may be arranged to route electrical signals in a direction of a plane that is substantially perpendicular to the surface of the substrate 102 upon which the device layer 104 is formed. In some embodiments, the via structures 128b may electrically couple trench structures 128a of different interconnect layers 106-110 together. In some implementations, the one or more interconnect structures 128 may also be referred to as conductive traces or routing structures. Although a particular number of interconnect structures 128 is depicted in FIG. 1A, embodiments of the present disclosure include IC devices having more or fewer interconnect structures 128 than depicted, or interconnect structures 128 having different configuration of trench structures 128a and via structures 128b than depicted.

The interconnect layers 106-110 may include a dielectric material 126 disposed between the interconnect structures 128, as shown in FIG. 1A. In some embodiments, the dielectric material 126 disposed between the interconnect structures 128 in different ones of the interconnect layers 106-110 may have different compositions. In other embodiments, the composition of the dielectric material 126 between different interconnect layers 106-110 may be the same.

A first interconnect layer 106 (referred to as Metal 1 or "M1") may be formed directly on the device layer 104. In some embodiments, the first interconnect layer 106 may include trench structures 128a and/or via structures 128b, as shown. The trench structures 128a of the first interconnect layer 106 may be coupled with contacts (e.g., the S/D contacts 124) of the device layer 104.

A second interconnect layer 108 (referred to as Metal 2 or "M2") may be formed directly on the first interconnect layer 106. In some embodiments, the second interconnect layer 108 may include via structures 128b to couple the trench structures 128a of the second interconnect layer 108 with the trench structures 128a of the first interconnect layer 106. Although the trench structures 128a and the via structures 128b are structurally delineated with a line within each interconnect layer (e.g., within the second interconnect layer 108) for the sake of clarity, the trench structures 128a and the via structures 128b may be structurally and/or materially contiguous (e.g., simultaneously filled during a dual-damascene process) in some embodiments.

A third interconnect layer 110 (referred to as Metal 3 or "M3") (and additional interconnect layers, as desired) may be formed in succession on the second interconnect layer 108 according to similar techniques and configurations described in connection with the second interconnect layer 108 or the first interconnect layer 106.

The IC device 100 may include a solder resist material 134 (e.g., polyimide or similar material) and one or more bond pads 136 formed on the interconnect layers 106-110. The bond pads 136 may be electrically coupled with the interconnect structures 128 and configured to route the electrical signals of the transistor(s) 140, or other active electronic devices, to other external devices. For example, solder bonds may be formed on the one or more bond pads 136 to mechanically and/or electrically couple a chip including the IC device 100 with another component (e.g., a circuit board). The IC device 100 may have other alternative configurations to route the electrical signals from the interconnect layers 106-110 than depicted in other embodiments. For example, the bond pads 136 may be replaced by or may further include other analogous features (e.g., posts) that route the electrical signals to external components.

Figure 1B:
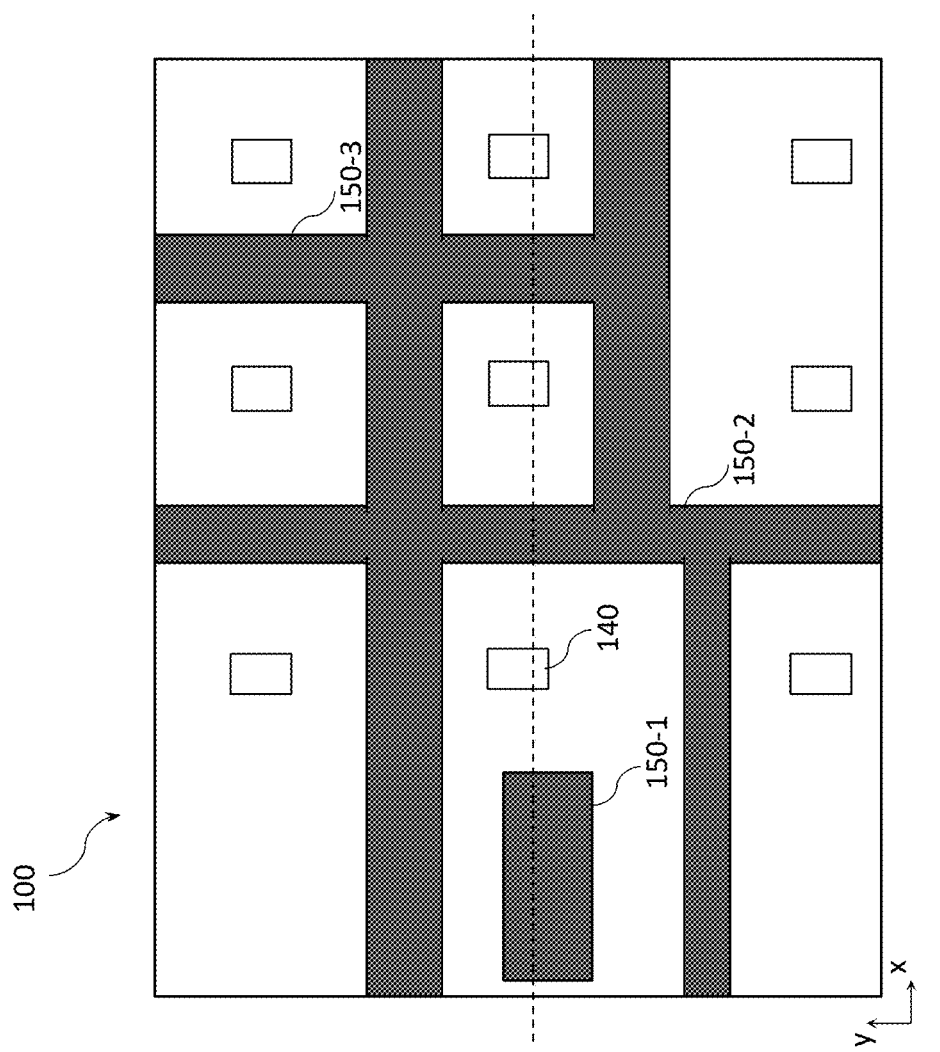
FIGS. 1B and 1C are top-down views of an IC device that may include one or more front-end metal structures, according to some embodiments of the present disclosure.
Figure 1C:
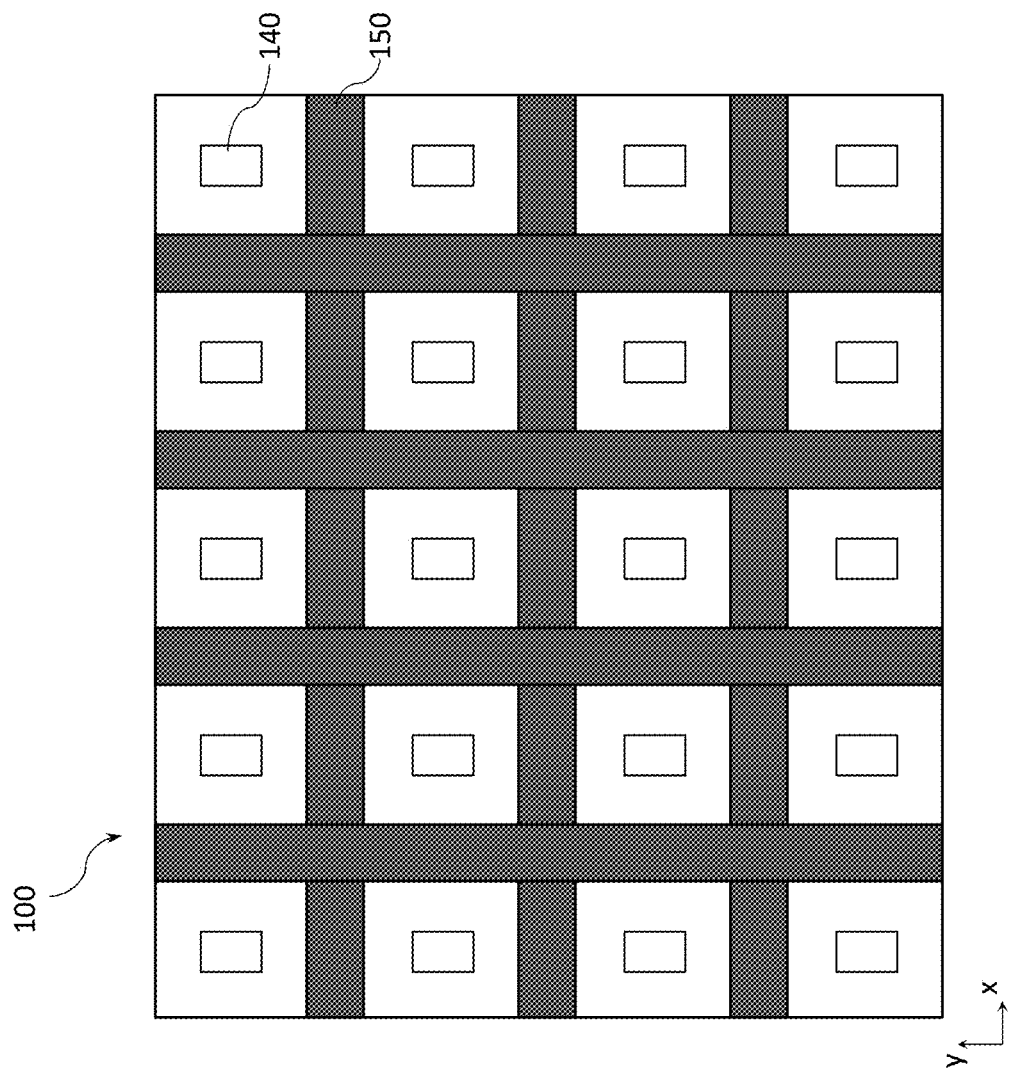

Also illustrated in FIG. 1A are metal structures 150, each of which can be any of the front-end metal structures as described herein. Although a particular number of metal structures 150 is depicted in FIG. 1A (namely, three metal structures, individually labeled as metal structures 150-1, 150-2, and 150-3), embodiments of the present disclosure include IC devices having more or fewer metal structures 150 than depicted, and/or IC devices with metal structures 150 having different configuration or provided in different locations than those depicted in FIG. 1A. Some examples of different configurations of the metal structures 150 in top-down views are illustrated in FIGS. 1B-1C, while some examples of different configurations of the metal structures 150 in cross-sectional views are illustrated in FIGS. 2-7. Each of FIGS. 2-7 illustrates an IC device similar to that of the IC device 100 shown in FIG. 1A, so that, unless stated otherwise, descriptions provided with reference to FIG. 1A are applicable to IC devices shown in FIGS. 2-7 (i.e., the IC devices shown in FIGS. 2-7 provide illustrations of different embodiments of the IC device 100). Therefore, in the interests of brevity, these descriptions are not repeated and only differences between the different embodiments of the IC devices 100 as shown in FIG. 1A and FIGS. 2-7 are described.

The metal structures 150 shown in FIG. 1A illustrate the general concept of front-end metal structures provided as thermal mitigation means, namely, that the IC device 100 may include one or more such structures, the metal structures 150 extending, at least, from a first face 152 of the substrate 102 towards, but not reaching all the way through to, a second face 154 of the substrate 102 (the second face 154 being opposite the first face 152). In other words, the metal structures 150 extend into the substrate 102, from the first face 152 down, to a depth that is smaller than the distance between the first face 152 and the second face 154 of the substrate. For example, in some embodiments, the height of the metal structures 150 (i.e., the dimension measured along the z-axis of the example coordinate system shown in FIGS. 1-7) may be between about 5 nanometers and 700 micrometers, including all values and ranges therein, e.g., between about 250 nanometers and 200 micrometers, or between about 500 nanometers and 200 micrometers. These height ranges are also applicable to embodiments where, as described below, the metal structures 150 may extend up from the first face 152 of the substrate 102, e.g., extend through the one or more device layers 104 and even into the BEOL that includes the metallization stack 119.

In various embodiments, the metal structures 150 may be implemented as openings, e.g., trench openings, filled with one or more metal materials. In some embodiments, the fill metal materials may include one or more of copper, zinc, tungsten, titanium, nickel, and aluminum, including various alloys of these metals. Zinc alloys and aluminum alloys may advantageously have relatively low melting temperatures (under 700 degrees Celsius), enabling them to be cast into complex geometrical arrangements without requiring expensive and difficult high casting techniques, as would be conventionally required by metals having high melting temperatures (such as copper). Zinc alloys and aluminum alloys may also be advantageously inexpensive relative to conventional copper. In other embodiments, the metal structures 150 may include a thermal interface material (TIM), e.g., a thermally conductive paste, or a thermally conductive epoxy (which may be a fluid when applied and may harden upon curing, as known in the art). In still other embodiments, the metal structures 150 may include stainless steel, silver, gold materials, including various alloys, as the fill materials. In still other embodiments, the metal structure 150 may include suitable silicides, nitrides, carbides, ceramic compounds or the like. In various embodiments, the metal structures 150 may have a thermal conductivity of at least about 50 W/m/K, e.g., at least about 200 W/m/K, or at least about 300 W/m/K. The selection of an appropriate material for the metal structures 150 may depend on the selection of the materials for other components included in the IC device 100; for improved heat transfer, it may be desirable for the metal structures 150 to have a thermal conductivity that is higher than a thermal conductivity of other components included in the IC device 100.

In some embodiments, the openings used to form the metal structures 150 may, first, be lined with a liner material, before being filled with one or more metal materials. A liner 156 shown as a thick black line at the sidewalls and the bottom of the metal structure 150-2 shown in FIG. 1A is an example of such a liner. In some embodiments, the liner 156 may be provided on all sidewalls and at the bottom of the openings that form the metal structures 150, as shown in FIG. 1A. In other embodiments, the liner 156 may be provided on the sidewalls but not at the bottom of the openings, or vice versa (not specifically shown in FIGS. 1-7). In general, the liner 156 may be provided on portions of at least some of the sidewalls of one or more openings in which the metal structures 150 are to be formed, or at least over at least a portion of the bottom of such openings. In some embodiments, the liner 156 may be deposited using, e.g., a conformal deposition technique such as atomic layer deposition (ALD).

In some embodiments, the liner 156 may serve as a diffusion barrier layer to prevent or at least reduce interdiffusion of materials on the opposite sides of the liner 156. For example, a diffusion barrier liner may be used to reduce or prevent diffusion of the one or more metals used to fill the metal structures 150 into the adjacent areas of the substrate 102. Examples of such diffusion barrier liner materials include, but are not limited to, tantalum (Ta), tantalum nitride (TaN), titanium (Ti), titanium nitride (TiN), ruthenium (Ru), and cobalt (Co). In some embodiments, the liner 156 may serve as an electrical insulator, preventing or minimizing the likelihood of forming an electrical connection between the one or more metals used to fill the metal structures 150 and adjacent electrically conductive elements within the substrate 102, e.g., an adjacent through-silicon-via (TSV). Examples of such insulator liner materials include, but are not limited to, fluorine-doped silicon dioxide, carbon-doped oxide (i.e., carbon-doped silicon dioxide), organosilicate glass, silicon oxycarbide, hydrogenated silicon oxycarbide, porous silicon dioxide, and organic polymer dielectrics such as polyimide, polytetrafluoroethylene, polynorbornenes, benzocyclobutene, hydrogen silsesquioxane and methylsilsesquioxane. In some embodiments, the liner 156 may include a stack of two or more liner materials, e.g., to provide both a diffusion barrier and electrical insulation with the surrounding materials/structures that may be included in the substrate 102.

In various embodiments, a thickness of the liner 156 may be between about 0.5 and 100 nanometers, including all values and ranges therein, e.g., between about 2 and 50 nanometers, or between about 5 and 10 nanometers. In general, a liner is understood to typically occupy a small fraction of the cross-sectional area of a component such as any of the metal structures 150.

In various embodiments, some of the metal structures 150 may include the liner 156, while others may not. In general, even though the liner 156 is only shown for the metal structure 150-2 of FIG. 1A, any of the metal structures 150 shown in any of FIGS. 1-7 may include the liner 156 according to any of the embodiments described herein. In other words, even though various ones of the metal structures 150 shown in FIGS. 1-7 do not specifically illustrate the liner 156 in order to not clutter the drawings, any one of them may include the liner 156 according to any of the embodiments described herein.

In some embodiments, any of the metal structures 150 may be provided in the vicinity of the active electronic components, e.g., the transistors 140, in order to provide an improved path to route heat generated by such components. An illustration of this is better provided with a tow-down view of the x-y plane of the exemplary coordinate systems shown in FIGS. 1-7 (as opposed to the cross-sectional side views of the x-z plane), two examples of which are provided in FIGS. 16-1C. The illustration of FIG. 1B may be seen as an illustration of the IC device 100 as shown in FIG. 1A, but in the top-down view, where the cross-section shown in FIG. 1A is a cross-section taken along a plane that includes a dashed line shown in FIG. 1B and that is perpendicular to the page of the drawing of FIG. 1B. Not all details shown in the cross-section views of FIG. 1A are shown in the top-down view of FIG. 1B in order to not clutter the drawing. For example, the top-down view of FIG. 1B is shown without showing components of the one or more device layers 104 except for some example locations of the gates of the transistors 140, and without showing any of the BEOL layers shown in FIG. 1A. Also, in some embodiments, the metal structures 150 may only start at the first face 152 of the substrate 102 and extend down towards the second face 154, which means that they would not be in the same plane with the gates 122 but would be below such gates. Therefore, the top-down view of FIG. 1B may be seen as a projection of the metal structures 150 and the gates 122 of the transistors 140 on a single x-y plane.

FIG. 1B illustrates that, in some embodiments, one or more of the metal structures 150 may at least partially surround active electronic devices, e.g., the transistors 140. For example, in some embodiments, when projected on a single plane parallel to the substrate 102 (i.e., when projected on a single x-y plane), a projection of the one or more metal structures 150 may enclose at least 25% of a perimeter of a projection of the at least one active electronic device. This is shown in FIG. 1B with eight of the nine example transistors shown in FIG. 1B being partially enclosed by the metal structures 150. In some embodiments, projections of some of the active electronic devices may be completely enclosed by the projections of the one or more metal structures 150. This is shown in FIG. 1B with one of the nine example transistors shown in FIG. 1B being completely enclosed by the metal structures 150 (the one of the transistors 140 which is in the center of the 3×3 array of the transistors 140 shown in FIG. 1B).

FIG. 1C provides another example top-down illustration of the IC device 100, showing that, in some embodiments, the metal structures 150 may be arranged as a grid, where different cells of the grid may surround (at least partially) zero or more active electronic devices of the IC device 100, e.g., transistors 140. In various embodiments, the metal structures 150 may adopt any suitable geometry as needed for a particular implementation to route heat away from the active electronic devices of the IC device 100, which geometries may be different from those shown in the examples of FIGS. 1B-1C. In some embodiments, the geometry of the one or more metal structures 150 may be selected based on the location of "white spaces" in the IC device 100, where "white spaces" is a term sometimes used to describe areas where no active electronic devices or corresponding interconnect structures are provided. In such embodiments, providing one or more of the metal structures 150 may still provide significant advantages in terms of thermal mitigation even when the location of the metal structures 150 is not strictly defined by the locations of the active electronic devices.

Further, while the cross-sections of the metal structures 150 are shown in FIG. 1A, and subsequent FIGS., as rectangular, in other embodiments, any of the metal structures 150 described herein may have any other suitable cross-sectional shapes, e.g., as dictated by, or sometimes inevitable, by various manufacturing processes used to fabricate such structures. In some embodiments, the cross-sectional shapes of the metal structures 150 may be selected to achieve a desired thermal distribution or to follow mechanical and/or geometrical constraints within the IC device 100. For example, in some embodiments, one or more of the metal structures 150 may have a trapezoidal cross-section, e.g., with the shorter parallel side of the trapezoid positioned further away from the second face 154 of the substrate 102 than the longer parallel side. In such an embodiment, heat absorbed by the area of the metal structure 150 corresponding to the shorter parallel side of the trapezoid may be transmitted through the metal structure 150 and distributed over the larger area of the metal structure 150 corresponding to the larger parallel side of the trapezoid. In some embodiments, the shape of the metal structures 150 may also be selected based on the material properties of the metal structures 150.

What is not specifically shown in FIGS. 1A-1C is that, in some embodiments, one or more of the metal structures 150 may be connected to a ground potential, or any other reference signal source, during the operation of the IC device 100. Doing so may be beneficial in that the metal structures 150 connected to the ground potential may provide electrical shielding to various components of the IC device 100, e.g., to portions of the transistors 140, or portions of the interconnect structures 128. In fact, while the metal structures 150 are primarily described herein in terms of their thermal mitigation capabilities, in some implementations when the metal structures 150 are connected to a ground potential or another signal source during operation of the IC device 100, the metal structures 150 as described herein may be used primarily for their electrical shielding abilities. Other advantages of connecting the metal structures 150 to a ground potential or any other signal source may include lowering the electrical resistance of a signal path, providing more reliable electrical connections by introducing redundant paths, saving space by replacing conventional traces, improving signal quality, and saving part of the conventional circuitry by exploiting inductive or capacitive properties of the trenches. In other embodiments, one or more of the metal structures 150 may be disconnected from any ground or signal sources during operation, i.e., the metal structures 150 may be electrically floating.

What is also not specifically shown in FIGS. 1A-1C is that, in some embodiments, one or more of the metal structures 150 may be thermally coupled to a heat exchanger. In various embodiments, the heat exchanger may include one or more of: a heat spreader, a heat pipe, solid or liquid TIMs, thermal fluids, graphite or metal tapes, graphite or metal sheets, thermal grease, or various other thermal management devices.

FIGS. 2-7 provide cross-sectional side views of other embodiments of the IC device 100. In FIGS. 1-7, same reference numerals are used to indicate functionally analogous elements, although, as explained herein, their configuration may be different according to different embodiments shown in these FIGS. Unless stated otherwise, descriptions provided above with reference to FIG. 1A are applicable to FIGS. 2-7 and, therefore, in the interests of brevity, are not repeated. Thus, FIGS. 2-7 are described in terms of their differences from FIG. 1A.

Figure 2:
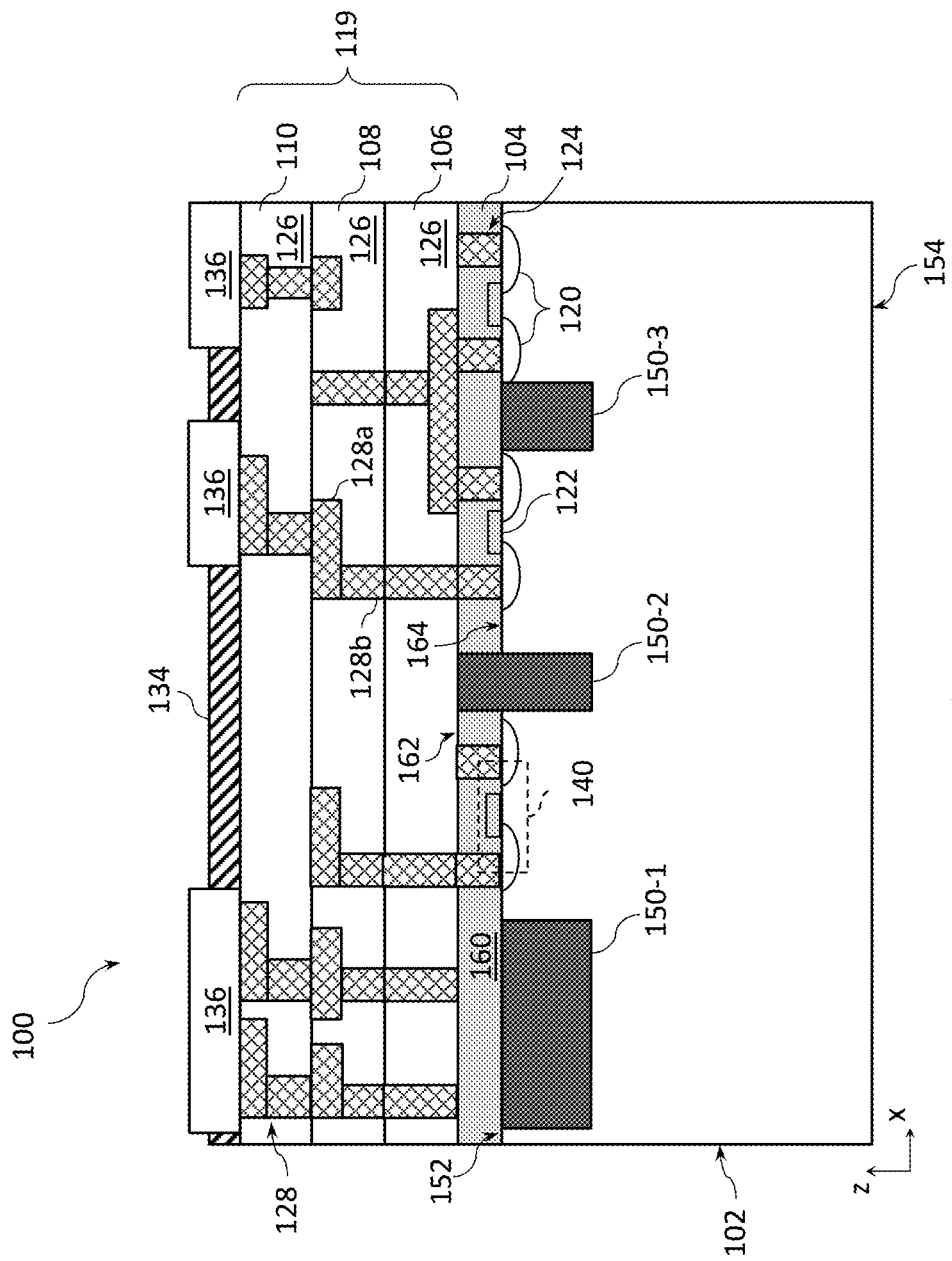
FIGS. 2-7 are cross-sectional side views of IC devices that may include one or more front-end metal structures, according to various embodiments of the present disclosure.

FIG. 2 illustrates an embodiment of the IC package 100 where, instead of starting at the first face 152 of the substrate 102, one of more of the metal structures 150 may start at a first face 162 of a dielectric material 160 providing electrical insulation of various components in the one or more device layers 104, and extend through the dielectric material 160 to a second face 164 of the dielectric material 160 and to the first face 152 of the substrate 102. Such an embodiment is shown in FIG. 2 for the metal structure 150-2, but, in general, any one of the metal structures 150 may extend through the dielectric material 160 of the one or more device layers 104 as described for the metal structure 150-2. In general, any suitable insulator material can serve as the dielectric material 160, e.g., any of the dielectric materials 126 described above. An embodiment where the metal structure 150 extends through the one or more device layers 104 may be advantageous in terms of manufacturing because the opening for the metal structure 150 may be formed once the one or more device layers 104 are formed, which can be technically realized in a straightforward manner by using well established process flows.

Figure 3:
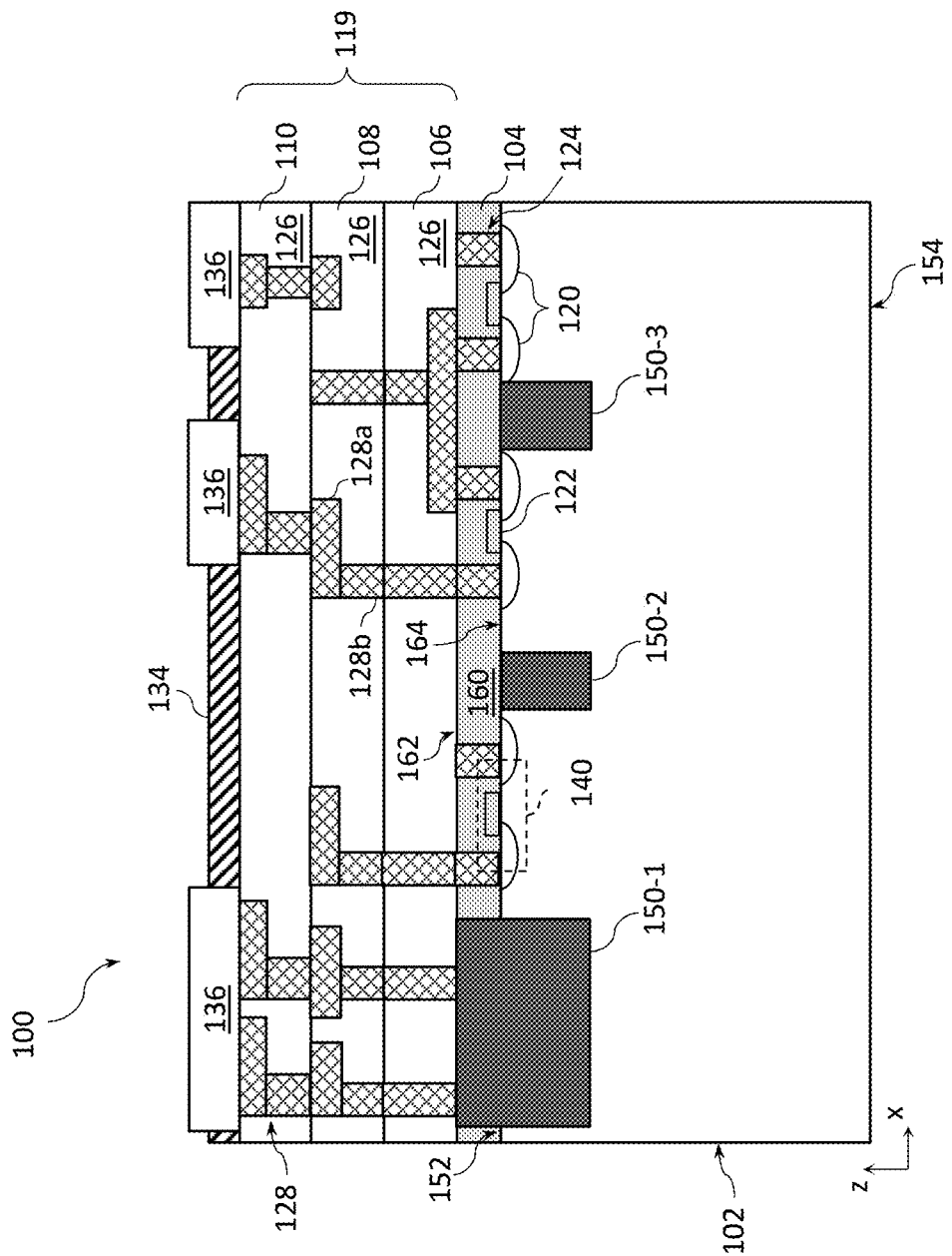

The embodiment of the metal structure 150-2 shown in FIG. 2 may also be advantageous because it may allow the metal structure 150 to be thermally and/or electrically connected to any of the interconnect structures 128 in the metallization stack 119. Such an embodiment is shown in FIG. 3 for the metal structure 150-1, but, in general, any one of the metal structures 150 may extend through the dielectric material 160 of the one or more device layers 104 as described for the metal structure 150-1 and be thermally and/or electrically coupled to one or more of the interconnect structures 128. The embodiment illustrated with the metal structure 150-1 in FIG. 3 may be advantageous because it allows combining the metal structure(s) 150 with existing interconnect structures 128, which may improve heat dissipation without requiring additional fabrication processes and without increasing process complexity (e.g., the metal structure(s) 150 may utilize standard interconnect structures 128 "as is"). As shown in FIG. 3, the metal structure 150-1 may be connected to one or more of: one or more trench structures 128a and one or more via structures 128b (i.e., in general, to one or more conductive traces or routing structures in the metallization stack 119). In some embodiments, the metal structure 150-1 may be connected to the ground potential or other sources via one or more of the interconnect structures 128 to which the metal structure 150-1 is coupled, e.g., via the bond pads 136 electrically coupled to such interconnect structures 128. In other embodiments, higher thermal conductivity of the metals of which the interconnect structures 128 are formed may already provide improvements in terms of heat dissipation provided by the metal structure 150-1.

Figure 4:
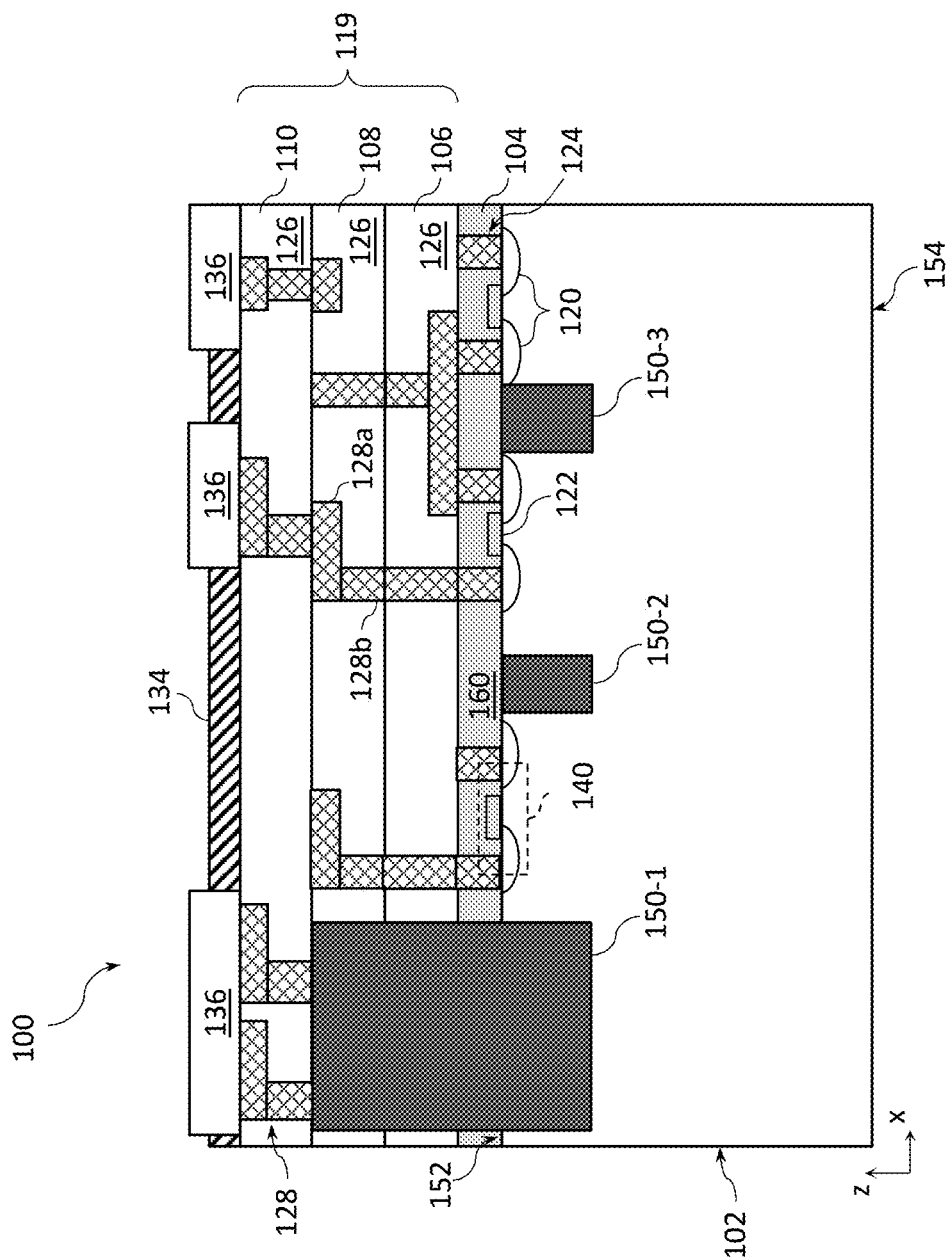

In some embodiments, the metal structure 150-1 shown in FIG. 3 may extend even further into the metallization stack 119, as shown with the metal structure 150-1 of FIG. 4. In general, any one of the metal structures 150 may extend into the metallization stack 119, e.g., through one or more interconnect layers 106-110 as shown with the metal structure 150-1 of FIG. 4 extending through two interconnect layers 106 and 108. Such embodiments may be advantageous in that they may allow introducing the metal structures 150 after at least portions of fabrication of the metallization stack 119 have been fabricated, thus allowing separate optimization of with respect to dimensions and electrical connectivity of the metal structures 150 (e.g., whether the metal structures 150 are connected to a ground potential) and with respect to materials used (e.g., the metal structures 150 do not have to be formed of the same material as the interconnect structures 128). In some embodiments, fabrication of the metal structure 150-1 as shown in FIG. 4 may overlap with at least some processes of fabricating the interconnect structures 128 of the IC device 100, but the embodiment of the metal structure 150-1 shown in FIG. 4 still allows fabrication of the metal structure 150-1 to be relatively independent of fabrication of the interconnect structures 128. In various embodiments, the metal structure 150-1 can be fabricated in one or more etching and filling steps. If more than one etching step is involved, the lateral dimensions of the metal structure 150-1 can vary along the vertical extension of the structure. If more than one filling step is involved, the filler material can vary along the vertical extension of the structure.

Figure 5:
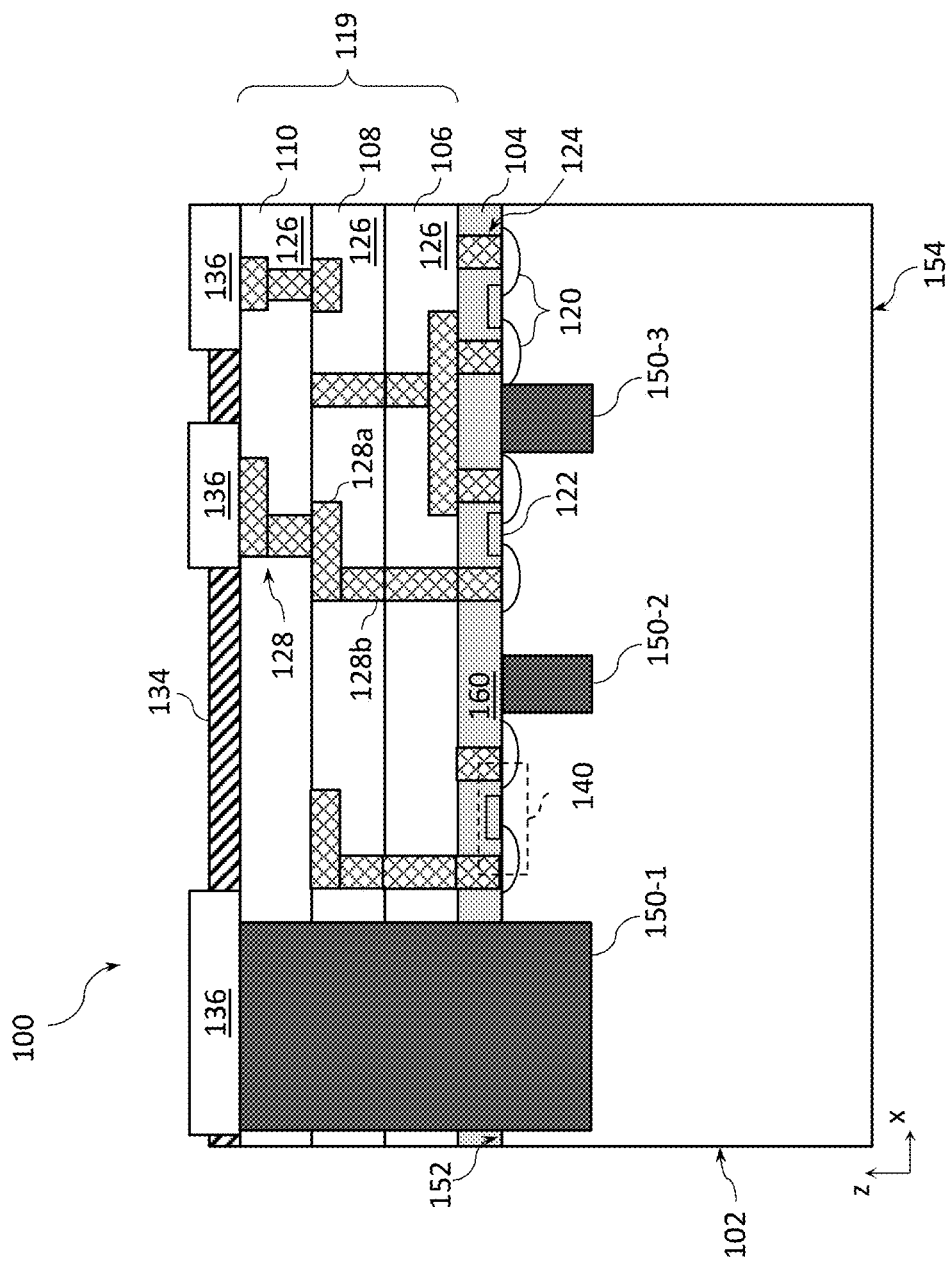

In some further embodiments, the metal structure 150-1 shown in FIG. 4 may extend all the way through the metallization stack 119 to directly couple to the one or more bond pads 136, as shown with the metal structure 150-1 of FIG. 5. In general, any one of the metal structures 150 may extend through the metallization stack 119, e.g., through all of the interconnect layers 106-110 as shown with the metal structure 150-1 of FIG. 5, and couple (thermally and/or electrically) to the one or more bond pads 136. Such embodiments may be advantageous in that the metal structures 150 may then be introduced after all interconnect layers 106-110 have been formed, before the bond pads 136 are formed. Thus, embodiment of FIG. 5 differs from the embodiment of FIG. 4 in that, in FIG. 4, the metal structure 150 is coupled to the bond pad 136 via one or more interconnect structures 128 in at least one interconnect layer above the metal structure 150 (namely, the interconnect layer 110), whereas, in FIG. 5, the metal structure 150 extends through all of the interconnect layers 106-110 and directly coupled to the bond pad 136.

Figure 6:
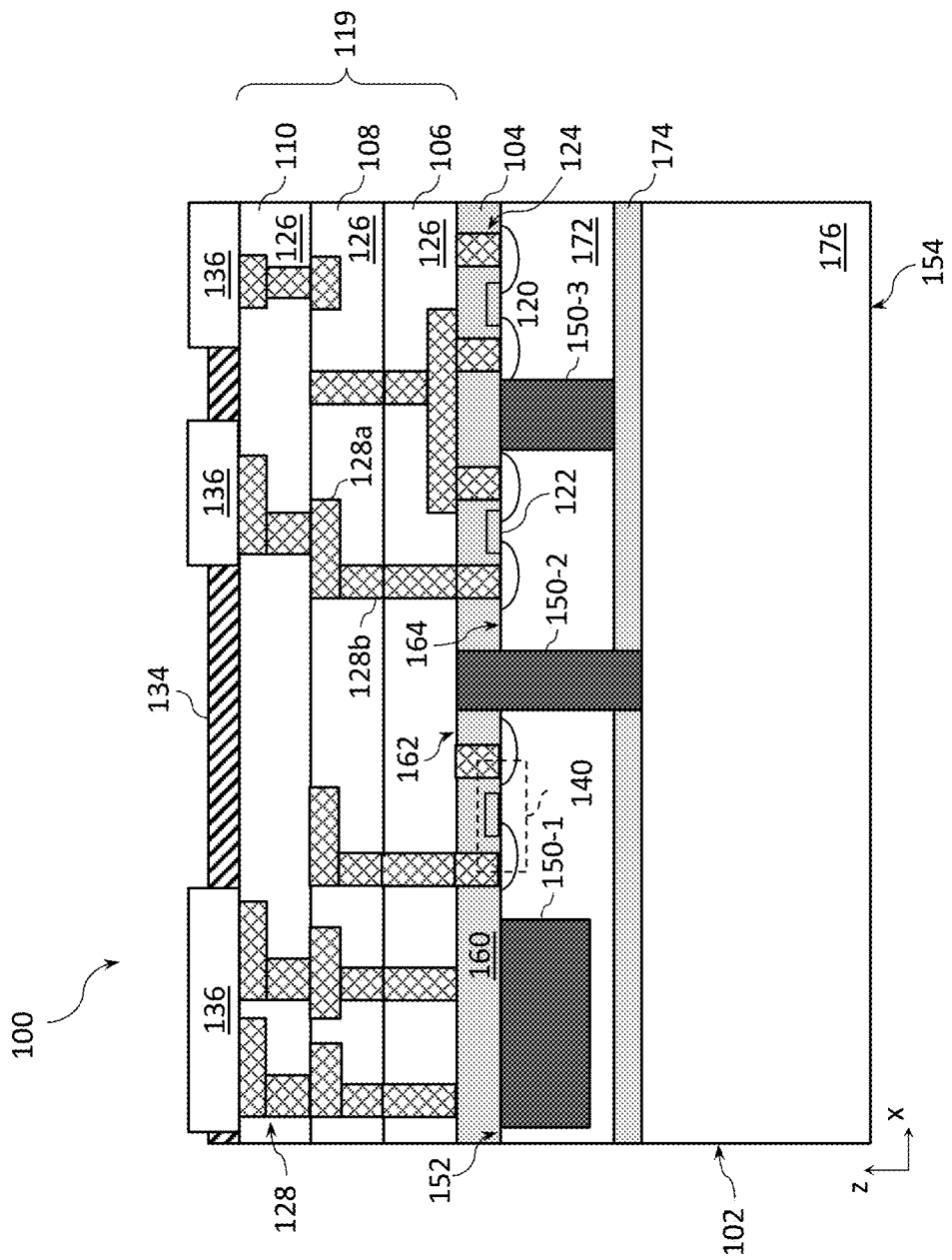
Figure 7:
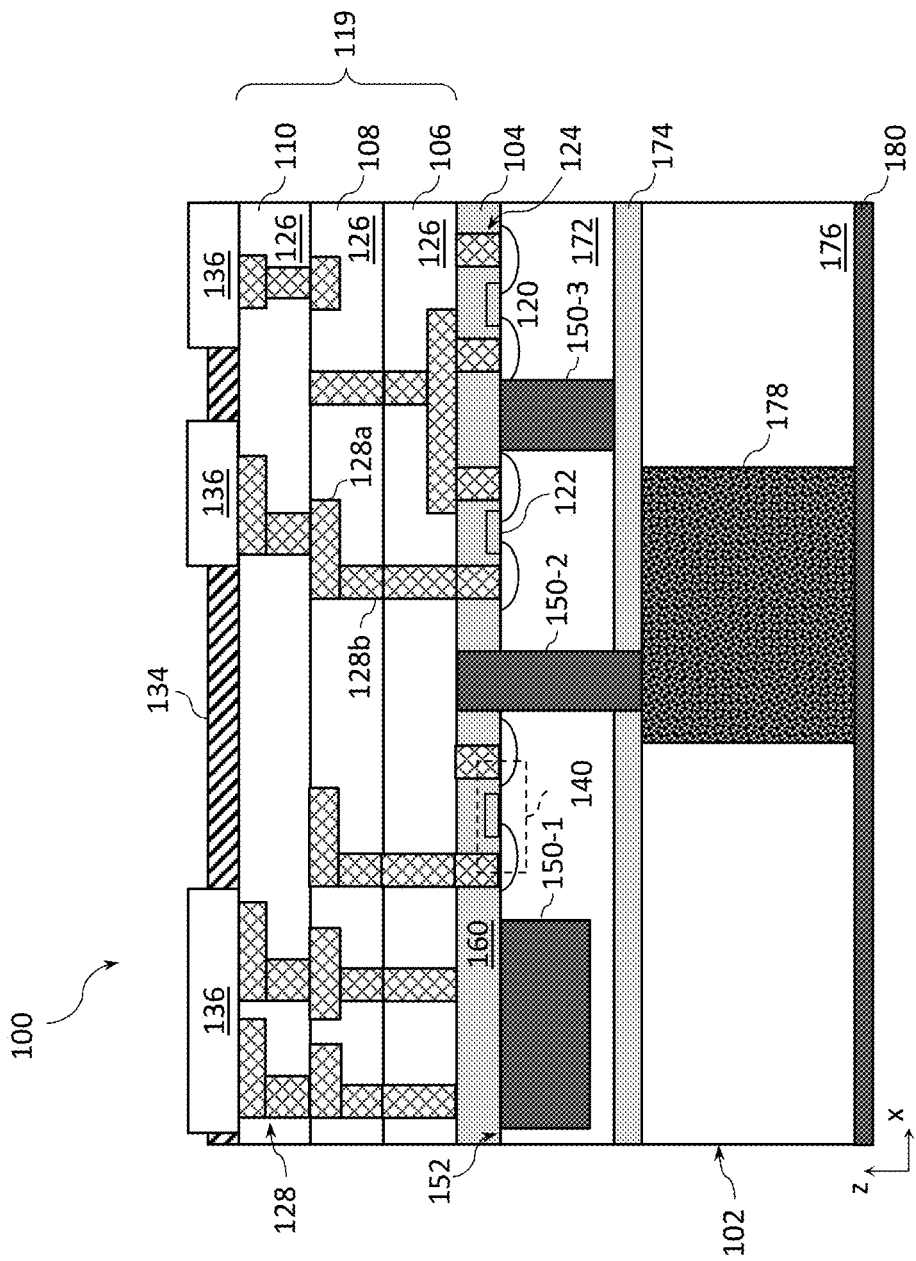

The embodiments of FIGS. 1-5 illustrate the metal structures 150 extending into a semiconductor material of the substrate 102 without showing any specific details of the substrate 102. In any of the embodiments shown in FIGS. 1-5, the substrate 102 may be an SOI substrate, in which different variations with respect to the metal structures 150 are possible. FIGS. 6 and 7 illustrate embodiments where the substrate 102 is an SOI substrate that includes a top semiconductor layer 172, an insulator layer 174, and a bulk semiconductor 176, where the insulator layer 174 is between the top semiconductor layer 172 and the bulk semiconductor 176. The semiconductor layer 172 may be referred to as the "top" semiconductor layer 172 because it is closer to the first face 152 of the substrate 102 (or the upper face of the semiconductor layer 172 may be the first face 152), compared to the bulk semiconductor 176.

Various one of the embodiments described with reference to FIGS. 1-5 may be implemented with the substrate being the SOI substrate as shown in FIGS. 6-7, where, in general, the metal structures 150 may extend from the first face 152 of the top semiconductor layer 172 of the SOI substrate 102 into at least the semiconductor material of the top semiconductor layer 172. In some embodiments, any of the metal structures 150 may not reach the insulator layer 174 of the SOI substrate 102, as shown in FIG. 6 with the metal structure 150-1. In some embodiments, any of the metal structures 150 may reach the insulator layer 174 of the SOI substrate 102, as shown in FIG. 6 with the metal structure 150-3 being in contact with the insulator layer 174 but not extending into the insulator layer 174. In some embodiments, any of the metal structures 150 may not only reach the insulator layer 174 of the SOI substrate 102, but also extend through the insulator layer 174 to reach the bulk semiconductor 176, as shown in FIG. 6 with the metal structure 150-2. In still some other embodiments which are not specifically shown in figures, any of the metal structures 150 may extend into the insulator layer 174 but not reach the bulk semiconductor 176, or any of the metal structures may extend into the bulk semiconductor 176.

The embodiment as shown with the metal structure 150-3 in FIG. 6 may be advantageous in that the insulator layer 174 may naturally serve as an etch stop for etching of the opening for the metal structure 150-3 (because typically the insulator material of the insulator layer 174 and the semiconductor material of the top semiconductor layer 172 are etch selective with respect to one another), providing an improved control of the etch process and the depth of the metal structure. As known in the art, two materials are described as "etch selective" when etchants used to etch one material do not substantially etch the other material.

The embodiment as shown with the metal structure 150-2 in FIG. 6 may be advantageous in that it allows coupling the metal structure 150-2 to the bulk semiconductor 176, because at the bottom of the insulator layer 174 the metal structure 150-2 comes into contact with the bulk semiconductor 176 which may have higher thermal conductivity than the top semiconductor layer 172, enabling improved heat dissipation. In some embodiments, the metal structure 150-2 that is thermally and/or electrically coupled to the bulk semiconductor 176 may further be coupled to a metal plug 178 provided in the bulk semiconductor 176, as shown in FIG. 7. In yet another embodiment, the metal plug 178 as shown in FIG. 7 may be coupled to a backside metallization layer 180, in case such a layer is present at the second face 154 of the substrate 102, so that the metal plug 178 may provide electrical and/or thermal conductivity between the metal structure 150-2 and the backside metallization layer 180. In some embodiments, the metal plug 178 may include substantially the same one or more metals as those used to fill the metal structure 150-2. In other embodiments, material compositions of the metal plug 178 and the fill materials of the metal structure 150-2 may be different. Descriptions provided with respect to the metal plug 178 and the backside metallization layer 180 as shown in FIG. 7 are also applicable to embodiments where the substrate 102 is not an SOI substrate, e.g., they may be combined with any of the embodiments of FIGS. 1-5.

Various IC devices with front-end metal structures as described herein, e.g., the IC devices 100 described with reference to FIGS. 1-7, do not represent an exhaustive set of arrangements utilizing front-end metal structures in a manner that allows providing improved heat dissipation and/or electrical shielding but merely provide examples of such arrangements. Although particular arrangements of materials are discussed with reference to FIGS. 1-7 illustrating example IC devices, in some embodiments, various intermediate materials may be included in the IC devices of these FIGS. Note that FIGS. 1-7 illustrating example IC devices are intended to show relative arrangements of the components therein, and that IC devices of FIGS. 1-7 may include other components that are not illustrated (e.g., various interfacial layers or various other components related to electrical connectivity or thermal mitigation). Additionally, although some components of the IC devices are illustrated in FIGS. 1-7 as being planar rectangles or formed of rectangular solids, this is simply for ease of illustration, and embodiments of these IC devices, in particular of the front-end metal structures 150, may be curved, rounded, or otherwise irregularly shaped as dictated by, and sometimes inevitable due to, the manufacturing processes used to fabricate various components.

In various embodiments, any of the features discussed with reference to any of FIGS. 1-7 herein may be combined with any other features to form an IC device with one or more front-end metal structures that may provide improved heat dissipation and/or electrical shielding, e.g., to form a modified IC device 100. Some such combinations are described above. In another example of such a combination, a modified IC device 100 may be substantially as the IC device shown in any of FIGS. 2-7, but that one or more of the metal structures 150 shown in FIGS. 2-7 may include the liner 156 as shown for the metal structure 150-2 illustrated in FIG. 1A. In further examples, modified IC devices 100 may include a metal structure 150 coupled to the bulk semiconductor 176 as shown for the metal structure 150-2 illustrated in FIG. 6 but also extend upwards from the first face 152 of the substrate, e.g., extend through the one or more device layers 104 as shown for the metal structure 150-2 illustrated in FIG. 2 or the metal structure 150-1 illustrated in FIG. 3, or extend even further through one or more interconnect layers 106-110 as shown for the metal structure 150-1 illustrated in FIG. 4 or 5. In similar examples, modified IC devices 100 may include a metal structure 150 coupled to the metal plug 178 and, optionally, to the backside metallization layer 180 as shown for the metal structure 150-2 illustrated in FIG. 7 (where the substrate 102 may be the SOI substrate as shown in FIG. 7 or not an SOI substrate) but also extend through one or more interconnect layers 106-110 as shown for the metal structure 150-1 illustrated in FIG. 4 or 5. These particular combinations are simply examples, and, in further embodiments, any combination of features described herein, in particular of features described with referenced to FIGS. 1-7, may be used.

Figure 13:
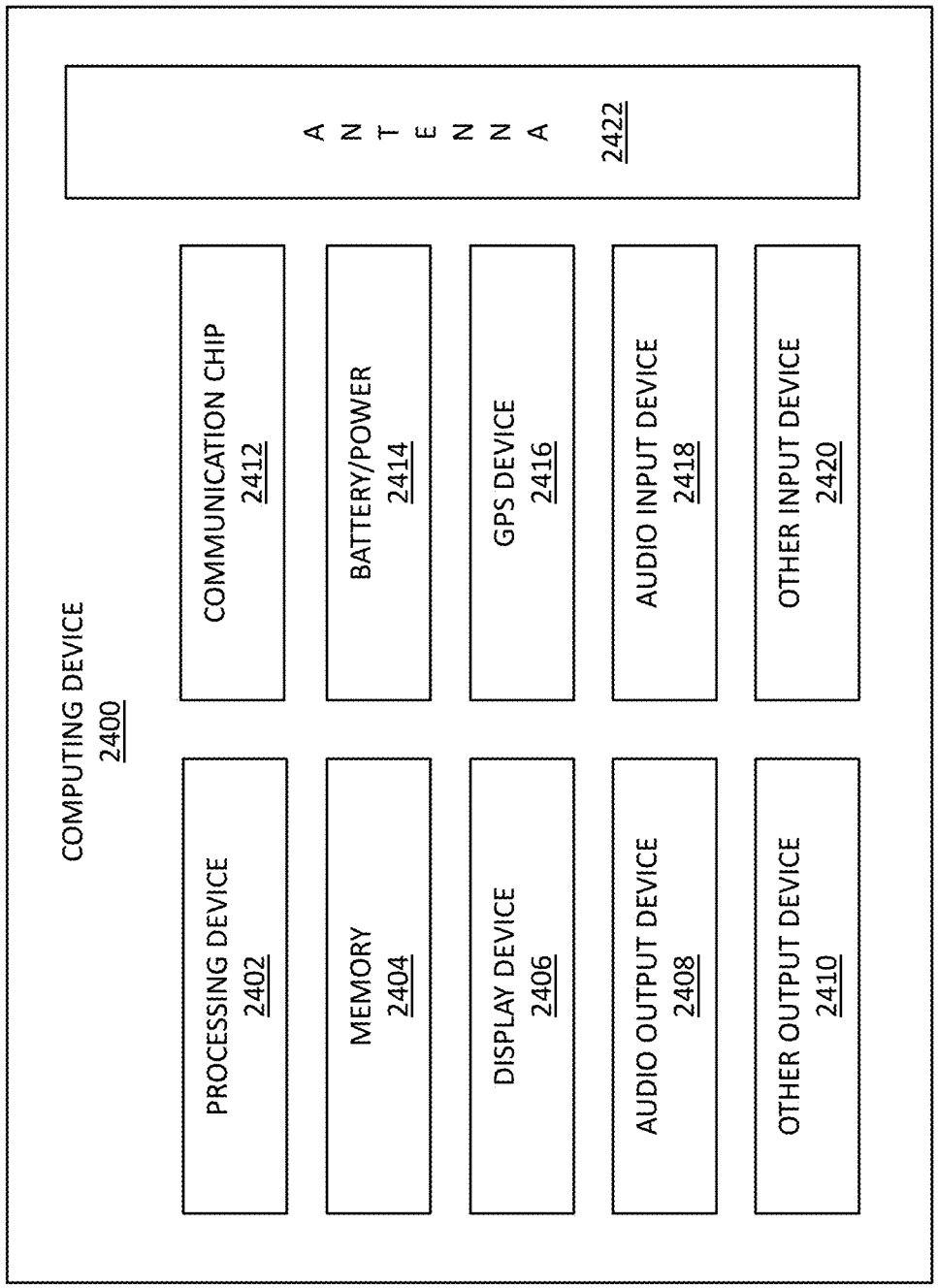
FIG. 13 is a block diagram of an example computing device that may include one or more front-end metal structures in accordance with any of the embodiments disclosed herein.

The IC devices 100 with front-end metal structures 150 disclosed herein may include circuitry for performing any computing task. For example, an IC device 100 may include processing circuitry (e.g., a server processor, a digital signal processor, a central processing unit, a graphics processing unit, etc.), memory device circuitry, sensor circuitry, wireless or wired communication circuitry, or any other suitable circuitry. FIG. 13 (discussed below) illustrates an example of a computing device 2400 which may include one or more of the IC devices 100 with front-end metal structures 150, e.g., to thermally manage one or more of its components; any suitable ones of the components of the computing device 2400 may be included in one or more IC devices 100 thermally managed using one or more front-end metal structures 150.

Manufacturing IC Devices with Front-End Metal Structures

Various IC devices with front-end metal structures as disclosed herein may be manufactured using any suitable techniques. In some implementations, a choice of fabrication processes may depend on whether the front-end metal structures as described herein are to be included in an SOI substrate (e.g., as shown in FIGS. 6-7) or a non-SOI substrate (e.g., as shown in FIGS. 1-5). In some implementations, a choice of a technique may depend on whether the front-end metal structures as described herein are to be extended into the metallization stack (e.g., as shown in FIGS. 4-5) or not (e.g., as shown in FIGS. 1-3, 6, and 7). In some implementations, a choice of fabrication processes may depend on whether the front-end metal structures as described herein are to be provided before or after the one or more device layers 104 are formed, or before or after the one or more interconnect layers 106-110 are formed. In some implementations, a choice of fabrication processes may depend on whether the front-end metal structures described herein are to be fabricated by a single or multiple etching processes, and/or whether the front-end metal structures described herein are to be fabricated by a single or multiple filling processes.

Figure 8:
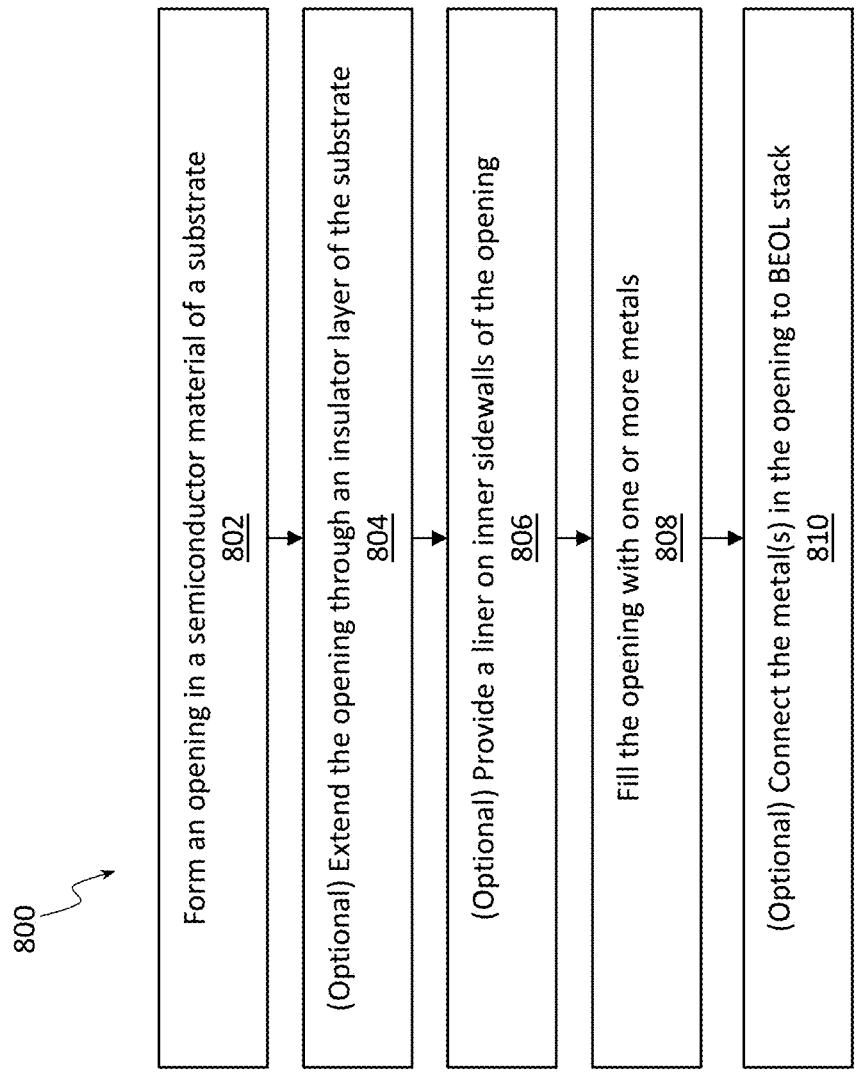
FIG. 8 is a flow diagram of an example method of fabricating an IC device with one or more front-end metal structures, according to various embodiments of the present disclosure.

FIG. 8 is a flow diagram of an example method 800 of manufacturing an IC device with one or more front-end metal structures according to some embodiments of the present disclosure.

Although the operations of the method 800 are illustrated in FIG. 8 once each and in a particular order, the operations may be performed in any suitable order and repeated as desired. For example, one or more operations may be performed in parallel to manufacture multiple front-end metal structures, or multiple IC devices with such front-end metal structures, substantially simultaneously. In another example, the operations may be performed in a different order to reflect the structure of a particular IC device in which one or more front-end metal structures may be included.

Furthermore, the operations illustrated in FIG. 8 may be combined or may include more details than described. For example, a process 802 of forming an opening in a semiconductor material and a process 804 of extending the opening through an insulator layer may happen in a single process step. In another example, the process 802 of forming the opening in the semiconductor material may include forming an opening in the device layer 160 and/or the dielectric layers 126.

Still further, the method 800 shown in FIG. 8 may further include other manufacturing operations related to fabrication of other components of the IC devices described herein, or any devices that include front-end metal structures or IC devices as described herein. For example, the method shown in FIG. 8 may include various cleaning operations, surface planarization operations (e.g., using chemical mechanical polishing), operations for surface roughening, operations to include barrier and/or adhesion layers as desired, and/or operations for incorporating the front-end metal structures as described herein in, or with, an IC component, a computing device, or any desired structure or device.

FIGS. 9A-9E are cross-sectional side views illustrating various example stages in the manufacture of an example IC device with a front-end metal structure using the method 800 shown in FIG. 8, according to some embodiments of the disclosure. While FIGS. 9A-9E are illustrated for the example of manufacturing a specific example of an IC device 900 depicted in these figures, discussions provided herein with respect to manufacturing the IC device 900 may be easily extended/modified to be applicable to all other IC device embodiments discussed herein. For the sake of consistency, reference numerals used to refer to certain elements of the IC device 100 are also used for the IC device 900.

The method 800 shown in FIG. 8 may begin with a process 802 that includes forming an opening in a semiconductor material of the substrate 102, the opening being used to house a front-end metal structure of an IC device.

Figure 9A:
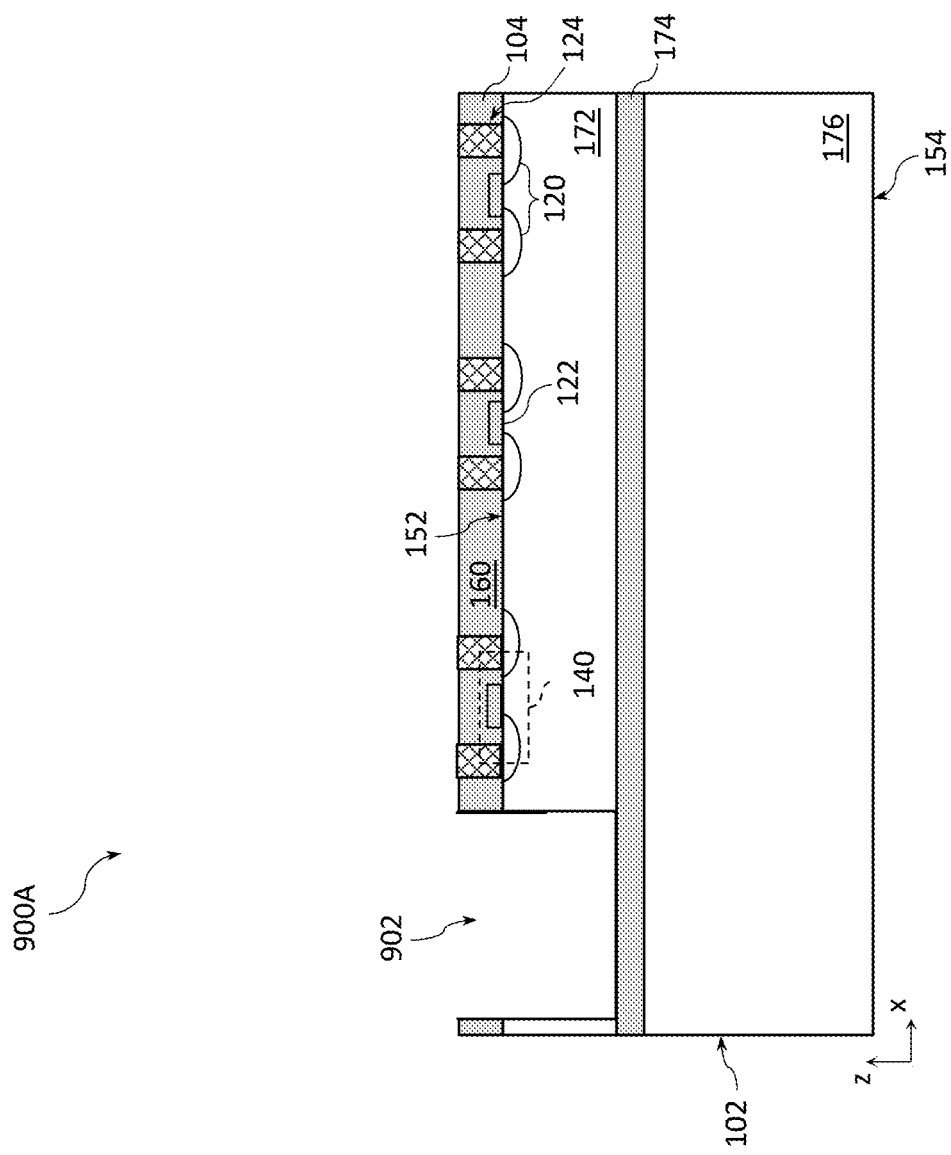
FIGS. 9A-9E are cross-sectional side views illustrating various example stages in the manufacture of an IC device with a front-end metal structure using the method shown in FIG. 8, according to some embodiments of the disclosure.

In embodiments where the metal structure to be included in the IC device is to extend through one or more device layers 104, the process 802 may include, first, forming one or more device layers 104 with their corresponding active electronic devices, e.g., the transistors 140, and then continue with forming an opening through the one or more device layers 104 and extending into the semiconductor material of the substrate 102. An example result of such an embodiment of the process 802 is shown in FIG. 9A illustrating an IC device 900A that includes an opening 902 that extends though the one or more device layers 104 and into the semiconductor material of the substrate 102. In various embodiments, the openings 902 may be formed in the process 802 using any suitable patterning technique, where, as used herein, "patterning" may refer to forming a pattern in one or more materials using any suitable techniques (e.g., applying a resist, patterning the resist using lithography, and then etching the one or more material using dry etching, wet etching, or any appropriate technique). Examples of patterning techniques include photolithographic or electron-beam (e-beam) or optical patterning, possibly in conjunction with a dry etch, such as radio frequency (RF) reactive ion etch (RIE) or inductively coupled plasma (ICP) RIE, or any other suitable etch technique to pattern a given material into a structure of a specified geometry for a given implementation, e.g., to pattern the one or more device layers 104 and the substrate 102 to form the opening 902 as described herein.

In the embodiments where the metal structure to be included in the IC device is not to extend through the one or more device layers 104 but is to start from the first face 152 of the substrate 102, the process 802 may include, forming the opening 902 that starts from the first face 152. In such embodiments, the one or more device layers 104 with their corresponding active electronic devices may be formed after the metal structure has been formed, or they may be formed in other areas above the substrate 102 and not over where the metal structure starting with the opening 902 is to be formed.

Figure 9B:
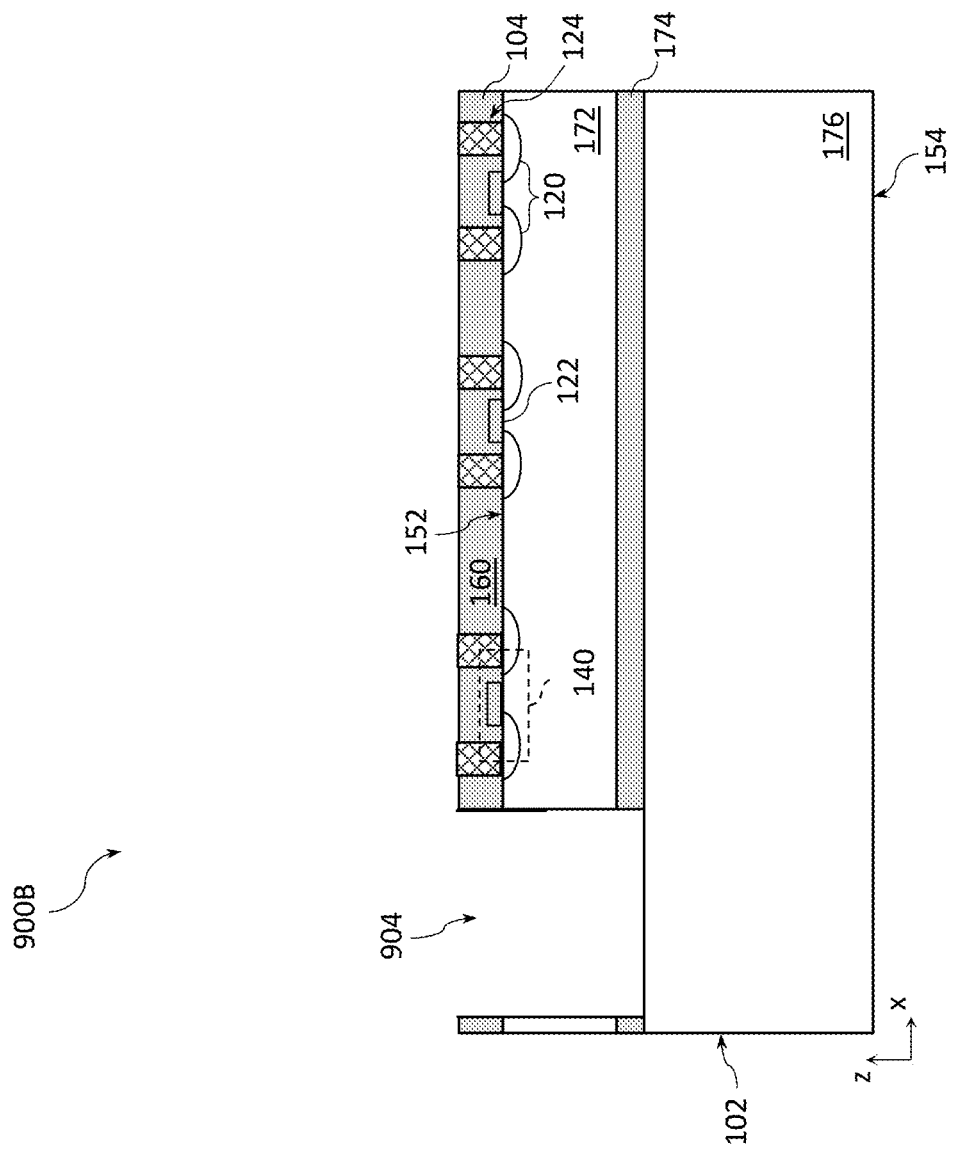

Turning back to the illustration of the embodiment of FIG. 9A, the IC device 900 shown in FIGS. 9A-9E is an embodiment of the IC device 100 where the substrate 102 is an SOI substrate. In such a case, the it can be that the insulator layer 174 is etch selective with respect to the top semiconductor layer 172 and the etch of the process 802 will remove the semiconductor material of the top semiconductor layer 172 but the insulator layer 174 will act substantially as an etch stop and stop the etch process. In such embodiments, the method 800 may further include a process 804 in which the opening formed in the process 802 is extended through the insulator layer 174 of the substrate 102, e.g., using any of the etch processes described above, using a suitable etchant. The process 804 is indicated in FIG. 8 as "optional" because when the substrate 102 is not an SOI substrate, or when the metal structure is not designed to extend through the insulator layer of an SOI substrate, then the process 804 is not to be carried out. An example result of the process 804 is shown in FIG. 9B illustrating an IC device 900B that includes an opening 904, which is a result of the opening 902 extending further through the insulator layer 174. In such an embodiment, the bulk semiconductor 176 of the SOI substrate 102 may act as an etch stop for the etchants used to etch through the insulator layer 174 in case the materials of these layers are etch selective with respect to one another. In other embodiments, the etching of the insulator layer 174 may be carefully controlled to stop the etching when the opening 904 reaches the bulk semiconductor 176.

In the embodiments where it is desirable that the opening 904 extends further into the bulk semiconductor 176, the method 800 may further include a process (not specifically shown in FIG. 8) for extending the opening 904 further down towards but not reaching the second face 154 of the substrate 102. A suitable etching process may be used to do this. It should also be noted that, in some embodiments, the etching of the processes 802 and 804 may be combined in that a single etching process may be used to form the opening 904.

The opening formed in the processes 802 and 804 may have any suitable geometry and dimensions for housing a front-end metal structure. For example, the opening may be a trench opening extending in the plane of the substrate 102 as to at least partially surround already formed or future active electronic devices, e.g., the transistors 140, to be included in the IC device 900. For example, the opening may be suitable for forming any of the metal structures shown in the top-down views of FIG. 1B or 1C.

Figure 9C:
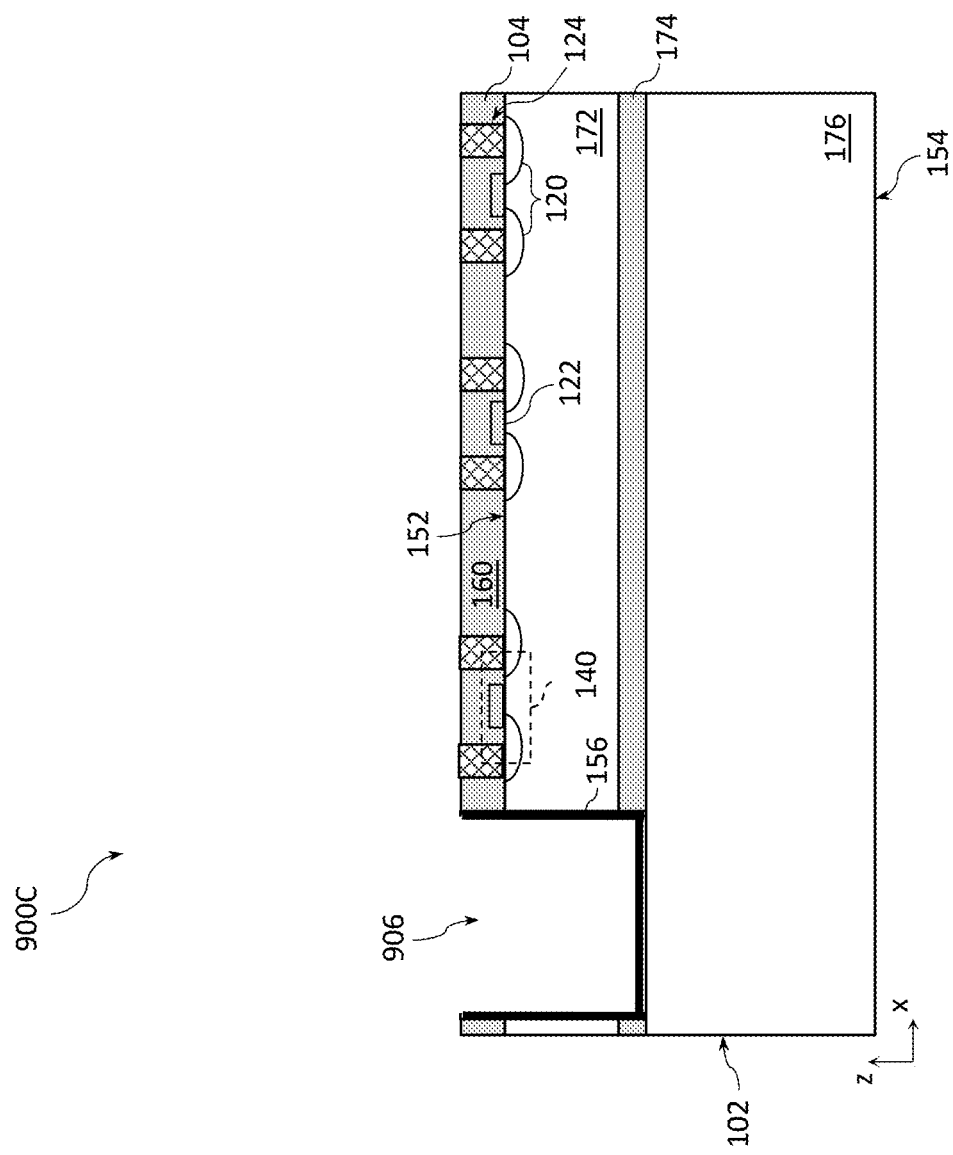

Once an opening of suitable geometry and dimensions has been formed in the substrate 102, the method 800 may proceed with a process 806 in which a liner is to be provided on at least portions of the inner sidewalls of the opening. The process 806 is indicated in FIG. 8 as "optional" because, as described above, presence of a liner is optional. An example result of the process 806 is shown in FIG. 9C illustrating an IC device 900C that includes an opening 906, which is a result of the opening 904 being lined with the liner 156. The liner 156 may be a diffusion barrier and/or electrical insulator liner, as described above. In various embodiments, the liner 156 may be deposited using any suitable deposition technique, such as sputtering, spin-coating, dip-coating, ALD, or chemical vapor deposition (CVD), possibly in combination with patterning. Furthermore, if the liner 156 is not to be deposited on all inner surfaces of the opening 904, then the process 806 may also include one or more processes to remove portions of the liner 156 deposited in areas where it is not desired, e.g., to remove the liner 156 from the bottom of the opening 904.

Figure 9D:
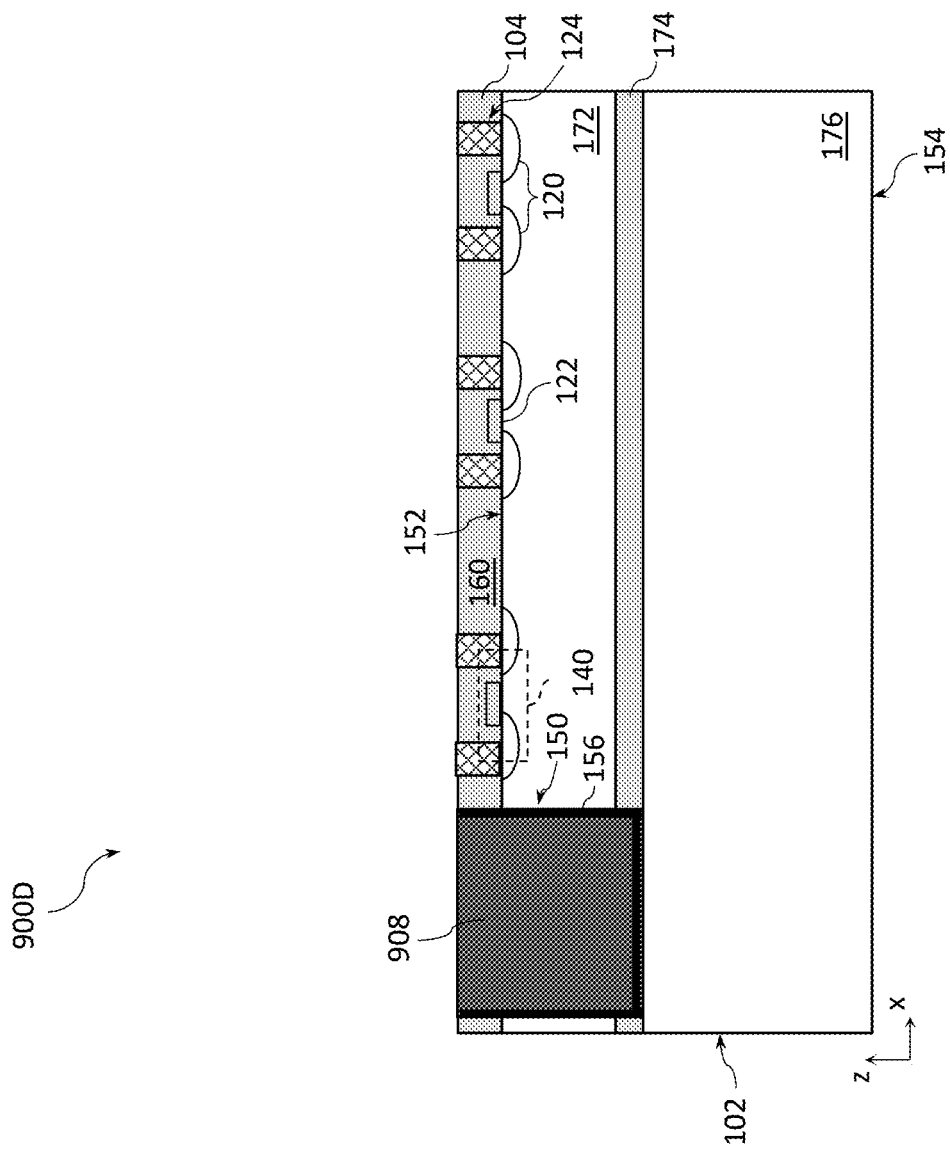

The method 800 may then proceed with a process 808 that includes filing the opening 906 with one or more fill metals. An example result of the process 808 is shown in FIG. 9D illustrating an IC device 900D that includes the opening 906 filled with one or more fill metals 908, thus forming a metal structure 150. In various embodiments, the one or more fill metals 908 may be any of the metals, or metal alloys, described above. The one or more fill metals 908 may be deposited within the opening 906 using any known technique for filling openings with such materials, such as physical vapor deposition (PVD) (e.g., evaporative deposition, magnetron sputtering, or e-beam deposition), electroplating, ALD, or CVD.

Figure 9E:
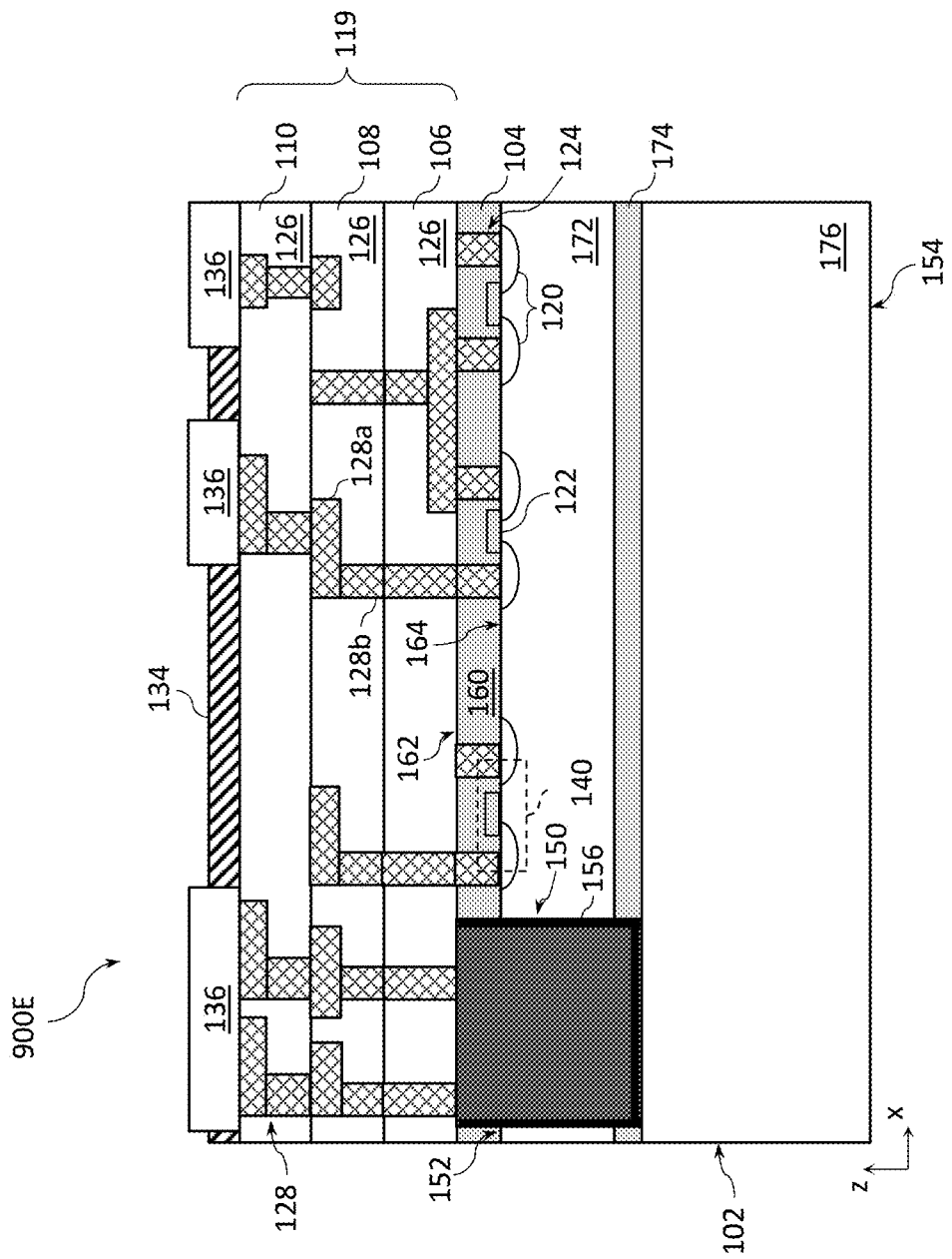

The method 800 may also include an optional process 810 in which the one or more metals 908 of the metal structure 150 formed in the process 808 are thermally and/or electrically connected to one or more interconnect structures 128 of the BEOL metallization stack 119. An example result of the process 810 is shown in FIG. 9E illustrating an IC device 900E that includes the metallization stack 119 formed over the opening 906 filled with the one or more fill metals 908. Any known processes may be used to form the metallization stack 119 with any desired interconnect structures 128.

Many variations are possible to the method shown in FIG. 8 and FIGS. 9A-9E, all of which being within the scope of the present disclosure. For example, the method 800 may further include processes for including a metal plug coupled to the metal structure 150, e.g., the metal plug 178 as described above. In another example, the metal structure 150 formed in the method 800 may be a metal structure that extends through one or more interconnect layers 106-110, in which case at least portions of the opening would be formed after the one or more interconnect layers 106-110 are formed. Such variations would be apparent to a person of ordinary skill in the art based on the descriptions provided herein, all of which variations being within the scope of the present disclosure.

Example Devices and Components

The front-end metal structures disclosed herein, e.g., any of the embodiments of the front-end metal structures 150, or the IC devices with such front-end metal structures, e.g., any of the embodiments of the IC devices 100, may be included in any suitable electronic component. FIGS. 10-13 illustrate various examples of structures and devices that may be used with or include any of the front-end metal structures, including any of the IC devices with such front-end metal structures, disclosed herein.

FIGS. 10A-10B are top views of a wafer 2000 and dies 2002 that may include one or more front-end metal structures in accordance with any of the embodiments disclosed herein, e.g., one or more of any embodiments of the front-end metal structures 150 described herein. In some embodiments, any of the IC devices 100, 900 described herein may be included in the dies 2002. In some embodiments, the dies 2002 may be included in an IC package along with one or more of the front-end metal structures as discussed above, in accordance with any of the embodiments disclosed herein, e.g., as discussed below with reference to FIG. 11.

The wafer 2000 may be composed of semiconductor material and may include one or more dies 2002 having IC structures that include one or more front-end metal structures as described herein formed on a surface of the wafer 2000. Each of the dies 2002 may be a repeating unit of a semiconductor product that includes any suitable IC (e.g., ICs including one or more front-end metal structures as described herein). After the fabrication of the semiconductor product is complete (e.g., after manufacture of the one or more front-end metal structures as described herein), the wafer 2000 may undergo a singulation process in which each of the dies 2002 is separated from one another to provide discrete "chips" of the semiconductor product. In particular, IC devices that include one or more front-end metal structures as disclosed herein may take the form of the wafer 2000 (e.g., not singulated) or the form of the die 2002 (e.g., singulated).

The die 2002 may include one or more active electronic components, e.g., one or more transistors (e.g., one or more of the transistors 140 of FIG. 1, discussed above) and/or supporting circuitry to route electrical signals to the transistors and other active electronic components, as well as any other IC components. In some embodiments, the wafer 2000 or the die 2002 may include a memory device (e.g., a static random access memory (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 13) or other logic that is configured to store information in the memory devices or execute instructions stored in the memory array.

Figure 11:
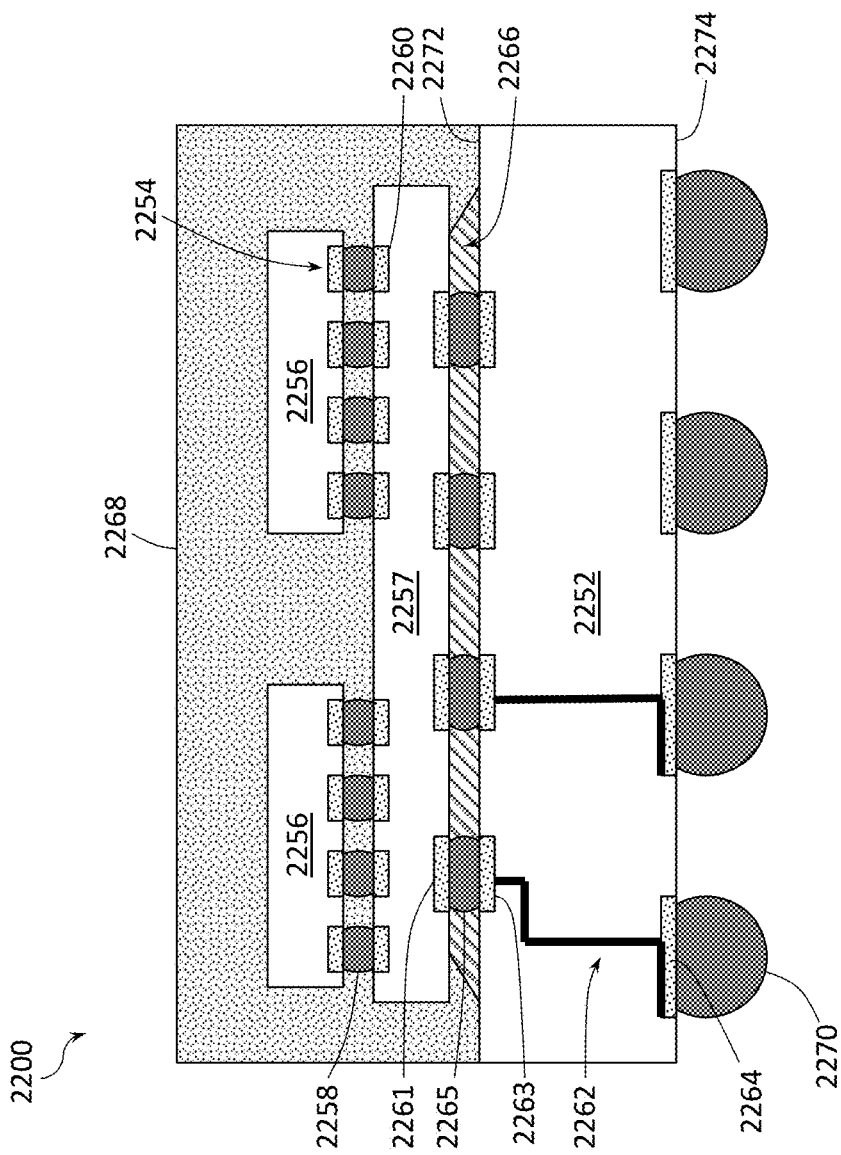
FIG. 11 is a cross-sectional side view of an IC package that may include one or more front-end metal structures in accordance with any of the embodiments disclosed herein.

FIG. 11 is a side, cross-sectional view of an example IC package 2200 that may include one or more front-end metal structures in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 128 discussed above with reference to FIG. 1.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 11 are solder bumps, but any suitable first-level interconnects 2265 may be used, such as solder bumps, solder posts, or bond wires. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 11 are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 11 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 12.

In various embodiments, any of the dies 2256 may include one or more of the IC devices 100, 900 with one or more front-end metal structures as described herein. The dies 2256 may take the form of any of the embodiments of the die 2002 discussed herein (e.g., may include any of the embodiments of the IC devices 100, 900). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory). In some embodiments, any of the dies 2256 may include one or more front-end metal structures, e.g., as discussed with reference to some of FIGS. 1-7 and FIG. 9. In some embodiments, some of the dies 2256 may not include any front-end metal structures.

Although the IC package 2200 illustrated in FIG. 11 is a flip chip package, other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 11, an IC package 2200 may include any desired number of dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 12:
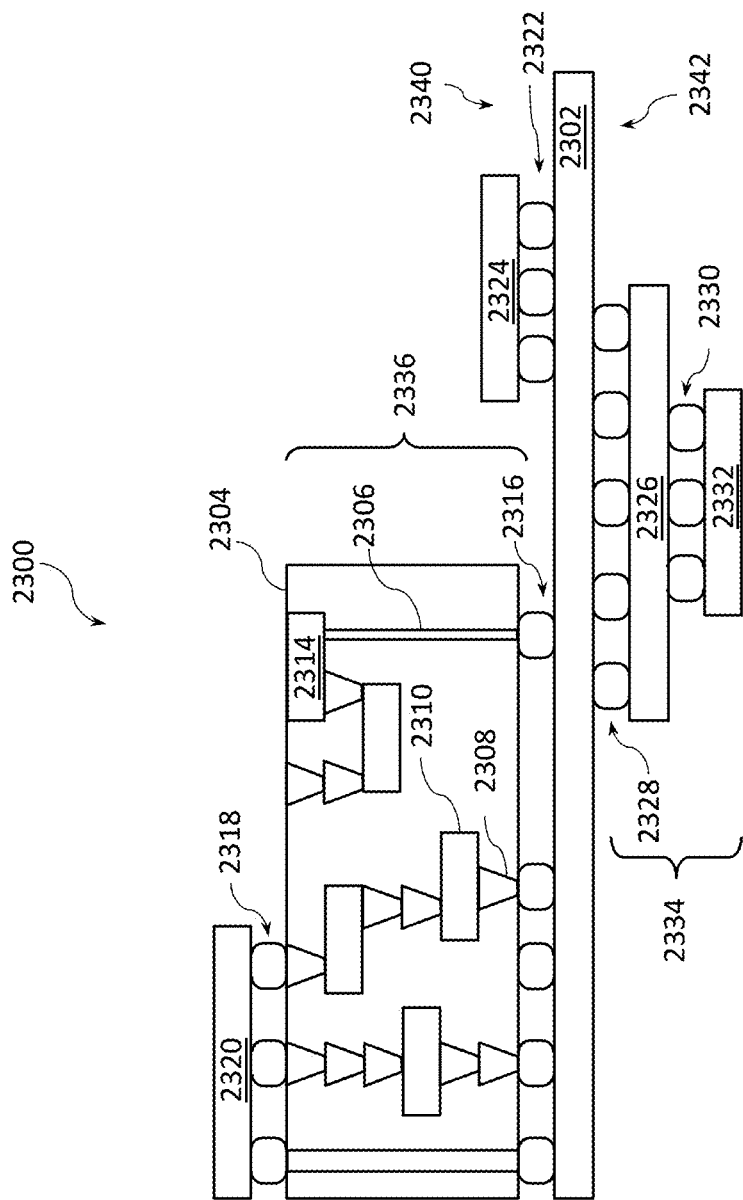
FIG. 12 is a cross-sectional side view of an IC device assembly that may include one or more front-end metal structures in accordance with any of the embodiments disclosed herein.

FIG. 12 is a cross-sectional side view of an IC device assembly 2300 that may include components having one or more front-end metal structures in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the front-end metal structures in accordance with any of the embodiments disclosed herein; e.g., any of the IC packages discussed below with reference to the IC device assembly 2300 may take the form of any of the embodiments of the IC package 2200 discussed above with reference to FIG. 11 (e.g., may include one or more front-end metal structures 150 included in the die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 12 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (as shown in FIG. 12), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 10B), an IC device (e.g., the IC device 100 discussed with reference to any of FIGS. 1-7 or the IC device 900 discussed with reference to FIG. 9), or any other suitable component. In particular, the IC package 2320 may include one or more front-end metal structures as described herein. Although a single IC package 2320 is shown in FIG. 12, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 12, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 12 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

FIG. 13 is a block diagram of an example computing device 2400 that may include one or more components with one or more front-end metal structures in accordance with any of the embodiments disclosed herein. For example, any suitable ones of the components of the computing device 2400 may include a die (e.g., the die 2002 (FIG. 10B)) including one or more front-end metal structures in accordance with any of the embodiments disclosed herein. Any one or more of the components of the computing device 2400 may include any embodiments of the IC devices 100, 900 with one or more front-end metal structures (e.g., as shown in FIGS. 1-7 and 9) and/or an IC package 2200 (e.g., as shown in FIG. 11). Any one or more of the components of the computing device 2400 may include an IC device assembly 2300 (e.g., as shown in FIG. 12).

A number of components are illustrated in FIG. 13 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-a-chip (SoC) die.

Additionally, in various embodiments, the computing device 2400 may not include one or more of the components illustrated in FIG. 13, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded dynamic random access memory (eDRAM) or spin transfer torque magnetic random access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides an IC device that includes a substrate and a metal structure at least partially in a semiconductor material of the substrate. The substrate has a first face and a second face, opposite the first face of the substrate, and at least one device is integrated at the first face of the substrate. The metal structure extends from the first face of the substrate into the substrate to a depth that is smaller than a distance between the first face and the second face.

Example 2 provides the IC device according to example 1, further including an insulator material above at least a portion of the first face of the substrate, where the metal structure extends through the insulator material (i.e., the insulator material has a first face and an opposing second face, the second face being the one closest to the substrate, and the metal structure extends from the first face of the substrate to the first face of the insulator material).

Example 3 provides the IC device according to example 2, further including one or more interconnect layers above the insulator material, where the metal structure is coupled (thermally and/or electrically) to one or more interconnect structures within the one or more interconnect layers.

Example 4 provides the IC device according to example 3, where the one or more interconnect structures include one or more of: one or more via structures and one or more trench structures (i.e., one or more of conductive traces or routing structures).

Example 5 provides the IC device according to examples 3 or 4, further including one or more bond pads electrically coupled to the one or more interconnect structures.

Example 6 provides the IC device according to example 5, where the one or more bond pads are provided within a dielectric layer, e.g., a solder resist layer, provided over the one or more interconnect layers.

Example 7 provides the IC device according to example 2, further including one or more interconnect layers above the insulator material, where the metal structure extends through at least one of the one or more interconnect layers.

Example 8 provides the IC device according to example 7, where at least one of the one or more interconnect layers includes one or more first interconnect layers (i.e., the metal structure extends through at least one or more first interconnect layers), the one or more interconnect layers further include one or more second interconnect layers above the one or more first interconnect layers (where the metal structure may but does not have to extend through), and the metal structure is coupled (thermally and/or electrically) to one or more interconnect structures within the one or more second interconnect layers.

Example 9 provides the IC device according to example 8, where the one or more interconnect structures within the one or more second interconnect layers include one or more of: one or more via structures and one or more trench structures.

Example 10 provides the IC device according to examples 8 or 9, further including one or more bond pads electrically coupled to the one or more interconnect structures within the one or more second interconnect layers.

Example 11 provides the IC device according to example 10, where the one or more bond pads are provided within a dielectric layer, e.g., a solder resist layer, provided over the one or more second interconnect layers.

Example 12 provides the IC device according to example 7, further including one or more bond pads over the one or more interconnect layers, where the metal structure extends through all of the one or more interconnect layers and is directly coupled (thermally and/or electrically) to the one or more bond pads.

Example 13 provides the IC device according to example 12, where the one or more bond pads are provided within a dielectric layer, e.g., a solder resist layer, provided over the one or more interconnect layers.

Example 14 provides the IC device according to any one of the preceding examples, where the substrate is a SOI substrate including an insulator layer between a bulk semiconductor structure and a semiconductor layer, the semiconductor layer being closer to, or including, the first face of the substrate than the bulk semiconductor structure, and semiconductor material of the substrate is a material of the semiconductor layer (i.e., the metal structure is in the semiconductor layer, where, in various embodiments, the metal structure may extend completely through the semiconductor layer and may stop at the insulator layer or may extend further into the insulator layer, or the metal structure may only extend partially through the semiconductor layer without reaching down to the insulator layer).

Example 15 provides the IC device according to example 14, where the metal structure extends through the semiconductor layer.

Example 16 provides the IC device according to example 15, where the metal structure further extends through the insulator layer and is, therefore, thermally coupled to the bulk semiconductor structure because at the bottom of the insulator layer the metal structure will come into contact with the bulk semiconductor structure.

Example 17 provides the IC device according to example 16, where the metal structure further extends into the bulk semiconductor structure.

Example 18 provides the IC device according to any one of the preceding examples, further including a metal plug extending from the second face of the substrate into the substrate, where the metal structure is coupled (thermally and/or electrically) to the metal plug.

Example 19 provides the IC device according to example 18, where the metal plug includes one or more metals different from one or more metals of the metal structure. In other examples, the metal plug and the metal structure may include at least some, or all, of the same metals.

Example 20 provides the IC device according to examples 18 or 19, further including a backside metallization layer over the second face of the substrate, where the metal plug is coupled (thermally and/or electrically) to the backside metallization layer.

Example 21 provides the IC device according to any one of the preceding examples, where the metal structure at least partially surrounds the at least one device.

Example 22 provides the IC device according to any one of the preceding examples, where, when projected on a single plane parallel to the substrate, a projection of the metal structure encloses at least 25%, e.g., at least 50%, of a perimeter of a projection of the at least one device.

Example 23 provides the IC device according to any one of the preceding examples, where, when projected on a single plane parallel to the substrate, a projection of the metal structure completely encloses a projection of the at least one device.

Example 24 provides the IC device according to any one of the preceding examples, where the metal structure is a grid.

Example 25 provides the IC device according to any one of the preceding examples, where the at least one device is one of a plurality of devices integrated at the first face of the substrate, and where portions of the grid surround at least portions of the plurality of devices.

Example 26 provides the IC device according to any one of the preceding examples, where the at least one device is at least one of a transistor, an amplifier, an attenuator, and a filter.

Example 27 provides the IC device according to any one of the preceding examples, where the metal structure is an opening filled with one or more metals.

Example 28 provides the IC device according to example 27, further including a liner on at least one sidewall of the opening, the liner being between the semiconductor material of the substrate and the one or more metals filling the opening.

Example 29 provides the IC device according to example 28, where the liner is a diffusion barrier.

Example 30 provides the IC device according to examples 28 or 29, where the liner is an insulator.

Example 31 provides the IC device according to any one of examples 28-30, where the liner has a thickness between about 0.5 and 100 nanometers, including all values and ranges therein, e.g., between about 2 and 50 nanometers, or between about 5 and 10 nanometers.

Example 32 provides the IC device according to any one of the preceding examples, where the metal structure is connected to a ground potential during operation of the IC device. In other examples, the metal structure may be disconnected from any signal sources during operation, i.e., the metal structure may be electrically floating.

Example 33 provides the IC device according to any one of the preceding examples, where the metal structure is thermally coupled to a heat exchanger, where, in various embodiments, the heat exchanger may include one or more of: a heat spreader, a heat pipe, solid or liquid TIMs, thermal fluids, graphite or metal tapes, graphite or metal sheets, and thermal grease.

Example 34 provides a method of fabricating an IC device, the method including forming an opening in a semiconductor material of a substrate, the opening extending from a first face of the substrate into the substrate to a depth that is smaller than a distance between the first face and a second face of the substrate, where the second face is opposite the first face; and filling the opening with one or more fill metals to form a metal structure that extends from the first face of the substrate into the substrate.

Example 35 provides the method according to example 34, further including lining at least one sidewall (or all sidewalls, or all exposed surfaces) of the opening with a liner prior to filling the opening with the one or more fill metals, where the liner is at least one of a diffusion barrier and an insulator (and further where the liner is according to any one of the preceding claims).

Example 36 provides the method according to examples 34 or 35, where forming the opening further includes forming the opening extending through an insulator material provided above the semiconductor material.

Example 37 provides the method according to example 36, where the insulator material includes at least portions of one or more devices integrated at the first face of the substrate.

Example 38 provides the method according to any one of examples 34-37, where forming the opening includes performing an etch to remove a portion of the semiconductor material of the substrate.

Example 39 provides the method according to example 36, where the substrate is a SOI substrate including an insulator layer between a bulk semiconductor structure and a semiconductor layer, the semiconductor layer being closer to, or including, the first face of the substrate than the bulk semiconductor structure, the semiconductor material of the substrate includes the semiconductor layer (i.e., the metal structure is in the semiconductor layer), and forming the opening further includes performing a further etch to remove a portion of the insulator layer to extend the opening through the insulator layer.

Example 40 provides the method according to example 39, where forming the opening further includes performing a still further etch to remove a portion of the bulk semiconductor structure to extend the opening into the bulk semiconductor structure.

Example 41 provides the method according to any one of examples 34-40, further including providing one or more interconnect structures within one or more interconnect layers above the substrate, where the metal structure is coupled (thermally and/or electrically) to the one or more interconnect structures.

Example 42 provides the method according to any one of examples 34-41, further including providing one or more interconnect structures within one or more interconnect layers above the substrate; and providing one or more bond pads above the one or more interconnect layers, where the metal structure is coupled (thermally and/or electrically) to the one or more bond pads, either directly or via one or more interconnect structures within the one or more interconnect layers.

Example 43 provides the method according to any one of examples 34-42, further including providing a metal plug extending from the second face of the substrate into the substrate, where the metal structure is coupled (thermally and/or electrically) to the metal plug.

Example 44 provides the method according to example 43, further including providing a backside metallization layer over the second face of the substrate, where the metal plug is coupled (thermally and/or electrically) to the backside metallization layer.

Example 45 provides the method according to any one of examples 34-44, further including processes for fabricating the IC device according to any one of the preceding examples (e.g., any one of examples 1-33).

Example 46 provides an IC package, including an IC die and a further component that is coupled to the IC die. In some implementation of the example 46, the IC die houses the IC device according to any one of the preceding examples (e.g., any one of examples 1-33). In other implementations of the example 46, the IC die includes a plurality of electronic devices (e.g., one or more of transistors, amplifiers, filters, etc.) in a FEOL layer, and further includes a metal structure in the FEOL layer, the metal structure being shaped as (i.e., forming) a blind via in a semiconductor material of the IC die. The latter IC die may be included in, or form, an IC device as described herein, and may further include features according to any one of the preceding examples (e.g., any one of examples 1-33).

Example 47 provides the IC package according to example 46, where the further component is one of a package substrate, a flexible substrate, or an interposer.

Example 48 provides the IC package according to examples 46 or 47, where the further component is coupled to the IC die via one or more first-level interconnects.

Example 49 provides the IC package according to example 48, where the one or more first-level interconnects include one or more solder bumps, solder posts, or bond wires.

Example 50 provides a computing device that includes an IC package and a circuit board, wherein the IC package is coupled to the circuit board. The IC package includes an IC die coupled to a package substrate, where the IC die includes at least one front-end transistor and a metal structure at least partially surrounding the front-end transistor, the metal structure being in a single device layer with the front-end transistor. Such an IC die may be included in, or form, an IC device as described herein, and may further include features according to any one of the preceding examples (e.g., any one of examples 1-33). In some implementations, the computing device according to example 50 may include the IC device according to any one of the preceding examples (e.g., any one of examples 1-33) and/or the IC package according to any one of the preceding examples (e.g., any one of examples 46-49).

Example 51 provides the computing device according to example 50, where the computing device is a server processor.

Example 52 provides the computing device according to example 50, where the computing device is a motherboard.

Example 53 provides the computing device according to example 50, where the computing device is a wearable computing device (e.g., a smart watch) or handheld computing device (e.g., a mobile phone).

Example 54 provides the computing device according to any one of examples 50-53, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. An integrated circuit (IC) device, comprising:
a substrate having a first face and a second face opposite the first face, wherein at least one device is at the first face of the substrate; and
a metal structure at least partially in a semiconductor material of the substrate, the metal structure extending from the first face of the substrate into the substrate to a depth that is smaller than a distance between the first face and the second face,
wherein, when projected on a single plane parallel to the first face of the substrate, a projection of the metal structure completely encloses a projection of the at least one device.

2. The IC device according to claim 1, further comprising an insulator material above at least a portion of the first face of the substrate, wherein the metal structure extends through the insulator material.

3. The IC device according to claim 2, further comprising one or more interconnect layers above the insulator material, wherein the metal structure is coupled to one or more interconnect structures within the one or more interconnect layers.

4. The IC device according to claim 2, further comprising one or more interconnect layers above the insulator material, wherein the metal structure extends through at least one of the one or more interconnect layers.

5. The IC device according to claim 4, wherein:
at least one of the one or more interconnect layers includes one or more first interconnect layers and one or more second interconnect layers above the one or more first interconnect layers, and
the metal structure is coupled to one or more interconnect structures within the one or more second interconnect layers.

6. The IC device according to claim 5, further comprising one or more bond pads electrically coupled to the one or more interconnect structures within the one or more second interconnect layers.

7. The IC device according to claim 4, further comprising one or more bond pads over the one or more interconnect layers, wherein the metal structure extends through all of the one or more interconnect layers and is coupled to the one or more bond pads.

8. The IC device according to claim 1, wherein:
the substrate is a silicon-on-insulator (SOI) substrate comprising an insulator layer between a bulk semiconductor structure and a semiconductor layer, and
the semiconductor material of the substrate is a material of the semiconductor layer.

9. The IC device according to claim 8, wherein the metal structure extends through the semiconductor layer.

10. The IC device according to claim 9, wherein the metal structure further extends through the insulator layer.

11. The IC device according to claim 10, wherein the metal structure further extends into the bulk semiconductor structure.

12. The IC device according to claim 1, further comprising a metal plug extending from the second face of the substrate into the substrate, wherein the metal structure is coupled to the metal plug, wherein the metal plug includes one or more metals different from one or more metals of the metal structure.

13. The IC device according to claim 12, further comprising a backside metallization layer over the second face of the substrate, wherein the metal plug is coupled to the backside metallization layer.

14. The IC device according to claim 1, wherein the metal structure at least partially surrounds the at least one device.

15. The IC device according to claim 1, wherein, when projected on a single plane parallel to the substrate, a projection of the metal structure encloses at least 25% of a perimeter of a projection of the at least one device.

16. The IC device according to claim 1, wherein the metal structure is a grid.

17. The IC device according to claim 1, wherein the metal structure is connected to a ground potential during operation of the IC device.

18. The IC device according to claim 1, wherein the metal structure is thermally coupled to a heat exchanger.

19. An integrated circuit (IC) package, comprising:
an IC die, the IC die comprising at least one device and a metal structure; and
a further component, coupled to the IC die,
wherein:
the IC die includes a substrate having a first face and a second face opposite the first face,
the device is at the first face of the substrate, and
the metal structure is at least partially in a semiconductor material of the substrate and extends from the first face of the substrate into the substrate to a depth that is smaller than a distance between the first face and the second face, wherein when projected on a single plane parallel to the first face of the substrate, a projection of the metal structure completely encloses a projection of the device.

20. The IC package according to claim 19, wherein the further component is one of a package substrate, a flexible substrate, or an interposer.

21. A computing device, comprising:
an integrated circuit (IC) package including an IC die coupled to a package substrate, wherein the IC die includes a device and a metal structure; and
a circuit board, wherein the IC package is coupled to the circuit board,
wherein:
the IC die includes a substrate having a first face and a second face opposite the first face, the device is at the first face of the substrate, and the metal structure is at least partially in a semiconductor material of the substrate and extends from the first face of the substrate into the substrate to a depth that is smaller than a distance between the first face and the second face, wherein when projected on a single plane parallel to the first face of the substrate, a projection of the metal structure completely encloses a projection of the device.

22. The computing device according to claim 21, wherein the computing device is one of a server processor, a motherboard, a wearable computing device, or a handheld computing device.

\* \* \* \* \*